United States Patent
Park et al.

(10) Patent No.: US 12,284,894 B2
(45) Date of Patent: Apr. 22, 2025

(54) DISPLAY DEVICE

(71) Applicant: Samsung Display Co., Ltd., Yongin-si (KR)

(72) Inventors: Chan Jae Park, Suwon-si (KR); Sang Duk Lee, Yongin-si (KR); Sun Ok Oh, Hwaseong-si (KR); Ki Kyung Youk, Bucheon-si (KR); Hyun A Lee, Seoul (KR); Soo Yeon Han, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 840 days.

(21) Appl. No.: 17/305,431

(22) Filed: Jul. 7, 2021

(65) Prior Publication Data

US 2022/0028962 A1 Jan. 27, 2022

(30) Foreign Application Priority Data

Jul. 22, 2020 (KR) ........................ 10-2020-0090822

(51) Int. Cl.
*H10K 59/131* (2023.01)
*H10K 59/88* (2023.01)

(52) U.S. Cl.
CPC ......... *H10K 59/1315* (2023.02); *H10K 59/88* (2023.02)

(58) Field of Classification Search
CPC ........ H10K 59/131–1315; H10K 59/88; G02F 1/13458; H05K 1/113; H05K 2201/09709; G09G 2300/0413
See application file for complete search history.

(56) References Cited

U.S. PATENT DOCUMENTS

| | | | |
|---|---|---|---|
| 5,914,763 A | 6/1999 | Fujii et al. | |
| 2006/0231900 A1 | 10/2006 | Lee et al. | |
| 2015/0144940 A1* | 5/2015 | Hong | H01L 27/1225 438/18 |
| 2019/0137808 A1* | 5/2019 | Koide | G02F 1/13452 |
| 2019/0245024 A1* | 8/2019 | Lim | H04N 9/3123 |
| 2019/0295974 A1* | 9/2019 | Muraoka | G02F 1/1345 |

FOREIGN PATENT DOCUMENTS

| | | | | |
|---|---|---|---|---|
| KR | 10-2017-0127109 A | | 11/2017 | |
| KR | 20190083394 | * | 7/2019 | ........... G09G 3/3406 |

* cited by examiner

*Primary Examiner* — Eric K Ashbahian
(74) *Attorney, Agent, or Firm* — Womble Bond Dickinson (US) LLP

(57) ABSTRACT

A display device includes: a first conductive layer including a signal line, which includes a pad contact part and a line part having a smaller width than the pad contact part along a first direction and extending from the pad contact part in a second direction that intersects the first direction, and a first non-contact pattern, which is spaced apart from the pad contact part, on a first side along the first direction; an insulating layer on the first conductive layer and including a contact hole that partially exposes the first conductive layer; and a second conductive layer on the insulating layer and including a first pad electrode, which is electrically connected to the first conductive layer through the contact hole, wherein the first pad electrode overlaps with the pad contact part and the first non-contact pattern.

18 Claims, 29 Drawing Sheets

RE: RE1, RE2, RE3, RE4, RE5, RE6

DISPLAY DEVICE

CROSS-REFERENCE TO RELATED APPLICATION

The present application claims priority to Korean Patent Application No. 10-2020-0090822, filed on Jul. 22, 2020, the disclosure of which is incorporated herein by reference in its entirety.

BACKGROUND

1. Field

Aspects of some example embodiments of the present disclosure relate to a display device.

2. Description of the Related Art

A display device is a device that visually displays data (e.g., images). The display device can be used not only in a portable electronic device such as a mobile phone, a smartphone, a tablet personal computer (PC), a smartwatch, a watchphone, a mobile communication terminal, an electronic notepad, an electronic book reader, a portable multimedia player (PMP), a navigation device, or an ultra-mobile PC (UMPC), but also in various other products such as a television (TV), a notebook computer, a monitor, a billboard, or an Internet-of-Things (loT) device, as display screen.

The display device may include a substrate that is divided into a display area and a non-display area. Pixels are generally located in the display area, and pads are generally located in the non-display area. Driving circuits may be mounted on the pads and may transmit driving signals to the pixels.

Each of the driving circuits may include a plurality of bumps, and the bumps may be bonded to pads that are separated from one another. However, if alignment tolerance occurs when the bumps are bonded to pads, the bonding reliability of the pads may be lowered.

The above information disclosed in this Background section is only for enhancement of understanding of the background and therefore the information discussed in this Background section does not necessarily constitute prior art.

SUMMARY

Aspects of some example embodiments of the present disclosure include a display device capable of improving the bonding reliability of pads.

However, embodiments according to the present disclosure are not restricted to those set forth herein. The above and other characteristics of embodiments according to the present disclosure will become more apparent to one of ordinary skill in the art to which the present disclosure pertains by referencing the detailed description of the present disclosure given below.

According to some example embodiments of the present disclosure, a display device comprises: a first conductive layer including a signal line, which includes a pad contact part and a line part having a smaller width than the pad contact part in a first direction and extending from the pad contact part in a second direction that intersects the first direction, and a first non-contact pattern, which is spaced apart from the pad contact part, on a first side in the first direction; an insulating layer on the first conductive layer and including a contact hole that partially exposes the first conductive layer; and a second conductive layer on the insulating layer and including a first pad electrode, which is electrically connected to the first conductive layer through the contact hole, wherein the first pad electrode overlaps with the pad contact part and the first non-contact pattern.

According to some example embodiments of the present disclosure, a display device comprisesa first pad including a first pad contact part, which has a first width in a first direction, and a first pad electrode, which covers the first pad contact part; and a second pad isolated from the first pad and adjacent to the first pad in a second direction that intersects the first direction, the second pad including a second pad contact part, which has a second width that is greater than the first width, and a second pad electrode, which covers the second pad contact part, wherein the first pad electrode overlaps with a first-side pattern, which is located in the same layer as the first pad contact part, on a first side of the first pad contact part, and a first second-side pattern, which is located on a second side of the first pad contact part, the second pad electrode overlaps with a second first-side pattern, which is located in the same layer as the second pad contact part, the first first-side pattern and the first second-side pattern are electrically isolated from the first pad, the second first-side pattern is electrically isolated from the second pad, and the first first-side pattern and the second first-side pattern are physically connected.

According to the aforementioned and other characteristics of embodiments according to the present disclosure, a display device with a high bonding reliability can be provided.

Other features and characteristics of embodiments according to the present disclosure may be more apparent from the following detailed description, the drawings, and the claims.

BRIEF DESCRIPTION OF THE DRAWINGS

The above and other embodiments and characteristics of the present disclosure will become more apparent by describing in detail embodiments thereof with reference to the attached drawings, in which.

DETAILED DESCRIPTION

Figure 1:
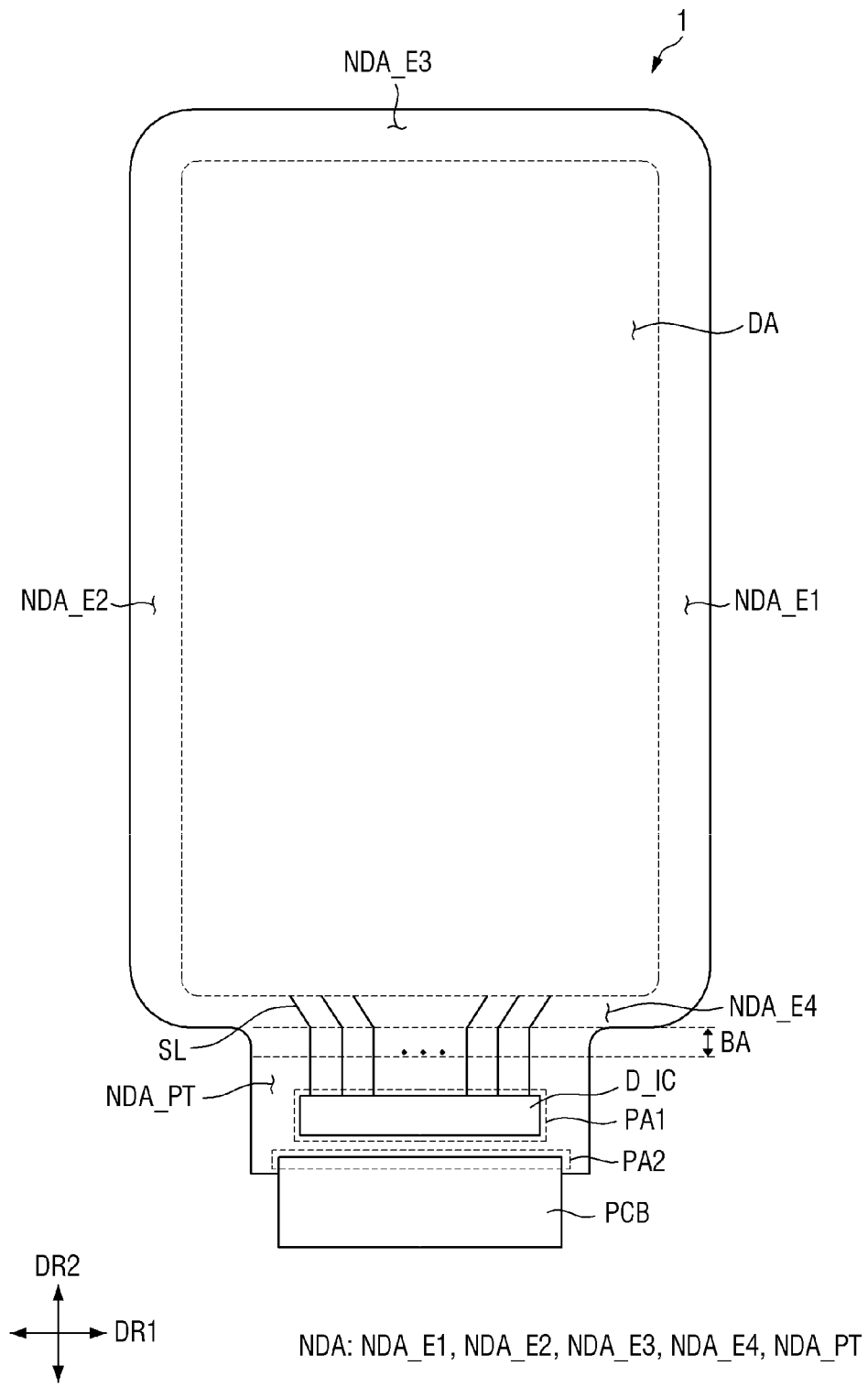
FIG. 1 is a plan view of a display device according to some example embodiments of the present disclosure.

Specific structural and functional descriptions of some example embodiments of the invention that are described herein are only for illustrative purposes of the embodiments according to the present invention. The present invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims and their equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Aspects of some example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, aspects of some example embodiments of the invention will be described with reference to the attached drawings.

FIG. 1 is a plan view of a display device according to some example embodiments of the present disclosure.

Referring to FIG. 1, a display device 1 may include a display area DA, which displays images, and a non-display area NDA, which is arranged around (or outside a footprint of) the display area DA. The display area DA of the display device 1 may have a rectangular shape with rounded corners in a plan view. In this case, the display area DA may have four rounded corners, two long sides, and two short sides.

First and second directions DR1 and DR2 may be different directions that intersect each other. FIG. 1 illustrates that horizontal and vertical directions are the first and second directions DR1 and DR2, respectively. In a plan view, a first side in the first direction DR1 may be a right direction, a second side in the first direction DR1 may be a left direction, a first side in the second direction DR2 may be an upper direction, and a second side in the second direction DR2 may be a lower direction. However, the first and second directions DR1 and DR2 may be relative directions, and embodiments according to the present disclosure are not limited thereto.

The long sides of the display area DA may extend in the second direction DR2, and the short sides of the display area DA may extend in the first direction DR1.

The non-display area NDA may completely surround the long sides, the short sides, and the four corners of the display area DA in a plan view. As illustrated in FIG. 1, in a plan view, the non-display area NDA may have the shape of a rectangular frame substantially surrounding the display area DA. For example, the non-display area NDA may include a first edge part NDA_E1, which is adjacent to the long side, on a first side in the first direction DR1, of the display area DA and extends in the second direction DR2, a second edge part NDA_E2, which is adjacent to the long side, on a second side in the first direction DR1, of the display area DA and extends in the second direction DR2, a third edge part NDA_E3, which is adjacent to the short side, on a first side, in the second direction DR2, of the display area DA and extends in the first direction DR1, and a fourth edge part NDA_E4, which is adjacent to the short side, on a second side, in the second direction DR2, of the display area DA.

The non-display area NDA may further include a protruding part NDA_PT, which protrudes from the fourth edge part NDA_E4 toward a second side, in the second direction DR2, of the non-display area NDA. The protruding part NDA_PT of the non-display area NDA may have a smaller width in the first direction DR1 than the fourth edge part NDA_E4. For example, the protruding part NDA_PT of the non-display area NDA may protrude from the center of the fourth edge part NDA_E4, which is spaced apart from the first and second edge parts NDA_E1 and NDA_E2. L-shaped cuts may be defined between the protruding part NDA_PT and the first and second edge parts NDA_E1 and NDA_E2 of the non-display area NDA.

The protruding part NDA_PT of the non-display area NDA may include a bending area BA, which extends in the first direction DR1 and has a width (e.g., a set or predetermined width) in the second direction DR2. The display device 1 may be bent or folded in the bending area BA.

The protruding part NDA_PT of the non-display area NDA may further include pad areas (PA1 and PA2). A plurality of pads may be located in the pad areas (PA1 and PA2). The pad areas (PA1 and PA2) may include a first pad area PA1, which is located relatively adjacent to the bending area BA, and a second pad area PA2, which is located relatively adjacent to the end of the protruding part NDA_PT. The first and second pad areas PA1 and PA2 may be spaced apart from each other in the second direction DR2.

The display device 1 may further include a driving member D_IC and a printed circuit board PCB. The driving member D_IC may overlap with the first pad area PA1 of the protruding part NDA_PT, and the printed circuit board PCB may overlap with the second pad area PA2 of the protruding part NDA_PT. The driving member D_IC may be coupled to a plurality of pads located in the first pad area PA1, and the printed circuit board PCB may be coupled to a plurality of pads located in the second pad area PA2 of the protruding part NDA_PT.

The pads in the first pad area PA1 that are coupled to the driving member D_IC may be connected to signal lines SL. The signal lines SL, which are connected to the pads in the first pad area PA1, may extend toward the display area DA. The signal lines SL may be connected to pixels in the display area DA. According to some example embodiments, wires or lines that electrically connect the first and second pad areas PA1 and PA2 may be located between the first and second pad areas PA1 and PA2.

Figure 2:
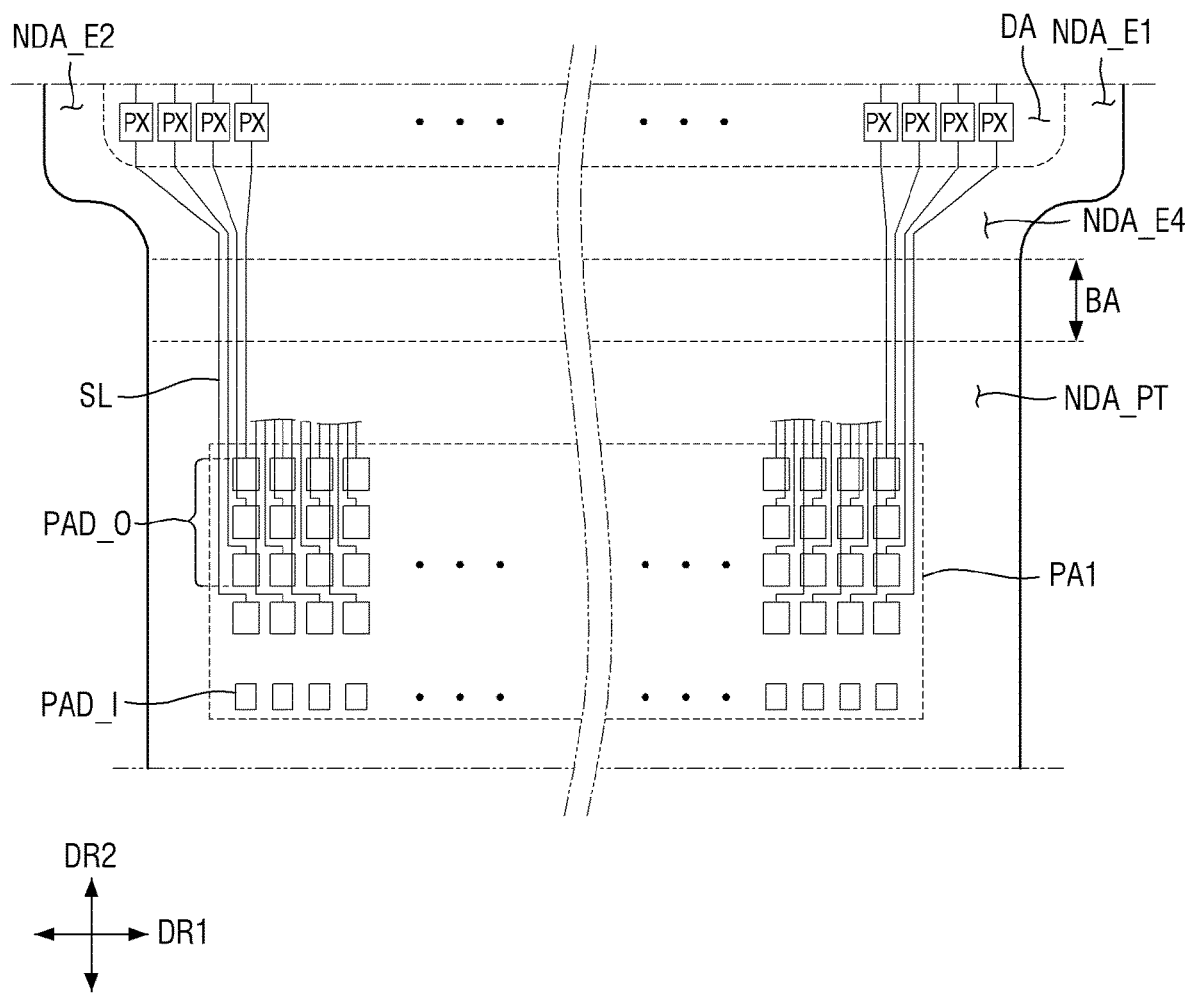
FIG. 2 is a plan view illustrating parts of a first pad area, a bending area, and a display area of the display device of FIG. 1.

FIG. 2 is a plan view illustrating parts of the first pad area, the bending area, and the display area of the display device of FIG. 1.

Referring to FIG. 2, as mentioned above, the display area DA may include a plurality of pixels PX. The pixels PX may be connected to the pads in the first pad area PA1 via the signal lines SL.

The signal lines SL may include line parts, which are connected to the pixels PX and extend past the fourth edge part NDA_E4 to the first pad area PA1, and pad contact parts, which are connected to the line parts and have an enlarged width, in the first direction DR1, compared to the line parts. An insulating layer may be located on the signal lines SL and may include contact holes, which expose the top surfaces of the pad contact parts. Pad electrodes may be located on the insulating layer and may be connected to the pad contact parts through the contact holes. The pads in the first pad area PA1 may include the pad contact parts and the pad electrodes.

The pads in the first pad area PA1 may include input pads PAD_I, which receive signals from the printed circuit board PCB of FIG. 1, and output pads PAD_O, which transmit signals output from the driving member D_IC of FIG. 1 to the pixels PX in the display area DA. The input pads PAD_I and the output pads PAD_O may be spaced apart from each other in the second direction DR2. The distance between the input pads PAD_I and the output pads PAD_O may be greater than the distance between output pad rows or input pad rows that will be described later.

As illustrated in FIG. 2, the input pads PAD_I may be arranged along the first direction DR1. The input pads PAD_1, which are arranged in the first direction DR1, may form a single input pad row.

The output pads PAD_O, unlike the input pads PAD_I, may form multiple output pad rows. In other words, the number of output pad rows formed by the output pads PAD_O may be greater than the number of input pad rows formed by the input pads PAD_1. For example, the output pads PAD_O may form four output pad rows. Each of the output pad rows, like the input pad row, may extend in the first direction DR1, and each pair of adjacent output pad rows may be spaced apart from each other in the second direction DR2.

The number of input pad rows formed by the input pads PAD_1 and the number of output pad rows formed by the output pads PAD_O are not particularly limited. For example, the input pads PAD_I may form one input pad row, and the output pads PAD_O may form two or three output pad rows. According to some example embodiments, the input pads PAD_I may form two or more input pad rows, and the output pads PAD_O may form three or four output pad rows or five or more output pad rows.

For convenience, the input pads PAD_I and the output pads PAD_O will hereinafter be collectively referred to as pads PADpq if they do not need to be differentiated. Here, "pq" as in, for example, "PADpq", refers to the coordinates (p, q) of each of the pads PADpq in the matrix of the pads PADpq.

Figure 3:
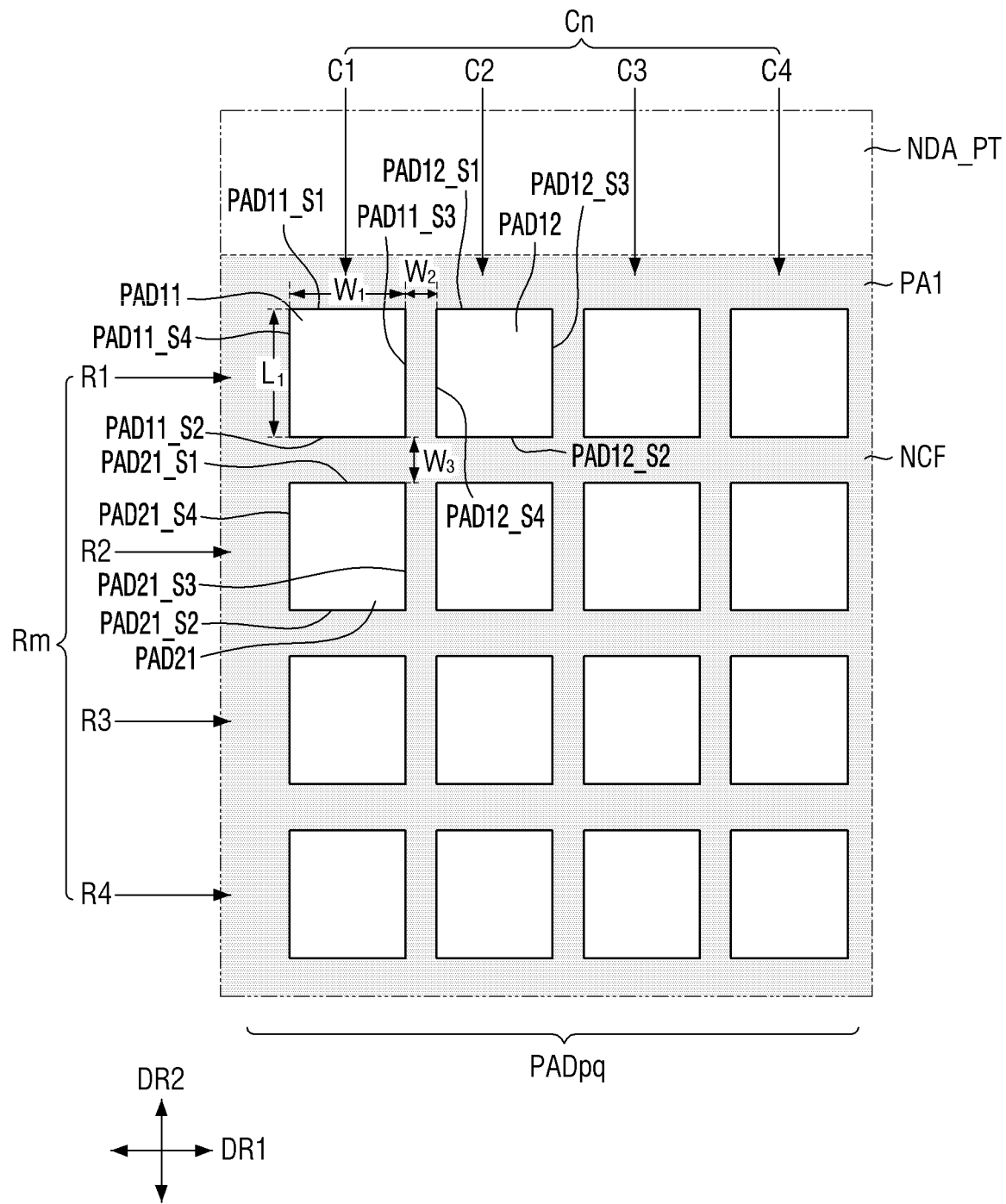
FIG. 3 is a layout view illustrating pads according to some example embodiments of the present disclosure.

The shapes and the arrangements of pads will hereinafter be described in more detail with reference to FIG. 3. FIG. 3 is a layout view illustrating pads according to some example embodiments of the present disclosure.

Referring to FIG. 3, pads PADpq in the first pad area PA1 may be arranged in rows Rm and columns Cn (where m and n are natural numbers).

The rows Rm may extend in the first direction DR1. The rows Rm may be spaced apart from one another in the second direction DR2.

The columns Cn may extend in the second direction DR2. The columns may be spaced apart from one another in the first direction DR1.

As mentioned above, the pads PADpq may be referred to by their coordinates. For example, a pad PAD11 in a first row R1 and a first column C1 will hereinafter be referred to as a (1,1)-th pad, a pad PAD12 in the first row R1 and a second column C2 will hereinafter be referred to as a (1,2)-th pad, a pad PAD13 in the first row R1 and a third column C3 will hereinafter be referred to as a (1,3)-th pad, a pad PAD14 in the first row R1 and a fourth column C4 will hereinafter be referred to as a (1,4)-th pad, a pad PAD21 in a second row R2 and the first column C1 will hereinafter be referred to as a (2,1)-th pad, a pad PAD22 in the second row R2 and the second column C2 will hereinafter be referred to as a (2,2)-th pad, a pad PAD23 in the second row R2 and the third column C3 will hereinafter be referred to as a (2,3)-th pad, a pad PAD24 in the second row R2 and the fourth column C4 will hereinafter be referred to as a (2,4)-th pad, a pad PAD31 in a third row R3 and the first column C1 will hereinafter be referred to as a (3,1)-th pad, a pad PAD32 in the third row R3 and the second column C2 will hereinafter be referred to as a (3,2)-th pad, a pad PAD33 in the third row R3 and the third column C3 will hereinafter be referred to as a (3,3)-th pad, a pad PAD34 in the third row R3 and the fourth column C4 will hereinafter be referred to as a (3,4)-th pad, a pad PAD41 in a fourth row R4 and the first column C1 will hereinafter be referred to as a (4,1)-th pad, a pad PAD42 in the fourth row R4 and the second column C2 will hereinafter be referred to as a (4,2)-th pad, a pad PAD43 in the fourth row R4 and the third column C3 will hereinafter be referred to as a (4,3)-th pad, and a pad PAD44 in the fourth row R4 and the fourth column C4 will hereinafter be referred to as a (4,4)-th pad.

As illustrated in FIG. 3, the pads PADpq may have the same shape and size.

The pads PADpq may have a rectangular shape in a plan view. For example, the pads PADpq may have a first width $W_1$ in the first direction DR1 and a first length $L_1$ in the second direction DR2.

In the pad arrangement of FIG. 3, the distance between the pads PADpq may be uniform. For example, each pair of adjacent pads PADpq may be spaced apart from each other by a second width $W_2$ in the first direction DR1. The distance, in the first direction DR1, between each pair of adjacent pads PADpq, i.e., the second width $W_2$, may be uniform in the entire pad arrangement of FIG. 3. Also, the pads PADpq may be arranged to be a third width $W_3$ apart from one another in the second direction DR2. The distance, in the second direction DR2, between the pads PADpq, i.e., the third width $W_3$, may be uniform in the entire pad arrangement of FIG. 3. The second and third widths $W_2$ and $W_3$ may be the same.

The pads PADpq may be arranged and aligned in the rows Rm and the columns Cn. In a case where the pads PADpq have a rectangular shape in a plan view, the pads PADpq may include first pad sides PADpq_S1, which extend in the first direction DR1 and are located on first sides, in the second direction DR2, of the pads PADpq, second pad sides PADpq_S2, which extend in the first direction DR1 and are located on second sides, in the second direction DR2, of the pads PADpq, third pad sides PADpq_S3, which extend in the second direction DR2 and are located on first sides, in the first direction DR1, of the pads PADpq, and fourth pad sides PADpq_S4, which extend in the second direction DR2 and are located on second sides, in the first direction DR1, of the pads PADpq. The second pad sides PADpq_S2 may face the first pad sides PADpq_S1, and the third pad sides PADpq_S3 may face the fourth pad sides PADpq_4.

The first pad sides PADpq_1 of the pads PADpq arranged in the same rows Rm may be connected to form first extension lines, and the first extension lines may extend in the first direction DR1. Similarly, the second pad sides PADpq_2 of the pads PADpq arranged in the same rows Rm may be connected to form second extension lines, and the second extension lines may extend in the first direction DR1, in parallel to the first extension lines.

The third pad sides PADpq_3 of the pads PADpq arranged in the same columns Cn may be connected to form third extension lines, and the third extension lines may extend in the second direction DR2. Similarly, the fourth pad sides PADpq_4 of the pads PADpq arranged in the same columns Cn may be connected to form fourth extension lines, and the fourth extension lines may extend in the second direction DR2, in parallel to the third extension lines.

The (1,1)-th pad PAD11 may include first, second, third, and fourth pad sides PAD11_S1, PAD11_S2, PAD11_S3, and PAD11_S4, the (1,2)-th pad PAD12 may include first, second, third, and fourth pad sides PAD12_S1, PAD12_S2, PAD12_S3, and PAD12_S4, and the (2,1)-th pad PAD21 may include first, second, third, and fourth pad sides PAD21_S1, PAD21_S2, PAD21_S3, and PAD21_S4.

The first pad sides PADpq_S1 of the pads PADpq arranged in the first row R1, e.g., the first pad sides PAD11_S1 and PAD12_S1 of the (1,1)- and (1,2)-th pads PAD11 and PAD12, may be connected to form first extension lines that may extend in the first direction DR1. Similarly, the second pad sides PADpq_S2 of the pads PADpq arranged in the first row R1, e.g., the second pad sides PAD11_S2 and PAD12_S2 of the (1,1)- and (1,2)-th pads PAD11 and PAD12, may be connected to form second extension lines that may extend in the first direction DR1, parallel to the first extension lines formed by the first pad sides PAD11_S1 and PAD12_S1 of the (1,1)- and (1,2)-th pads PAD11 and PAD12.

The third pad sides PADpq_S3 of the pads PADpq arranged in the first column C1, e.g., the third pad sides PAD11_S3 and PAD12_S3 of the (1,1)- and (1,2)-th pads PAD11 and PAD12, may be connected to form third extension lines that may extend in the second direction DR2. Similarly, the fourth pad sides PADpq_S4 of the pads PADpq arranged in the first column C1, e.g., the fourth pad sides PAD11_S4 and PAD12_S4 of the (1,1)- and (1,2)-th pads PAD11 and PAD12, may be connected to form fourth extension lines that may extend in the second direction DR2, parallel to the third extension lines formed by the third pad sides PAD11_S3 and PAD12_S3 of the (1,1)- and (1,2)-th pads PAD11 and PAD12.

A non-conductive coupling member NCF may be further located in the first pad area PA1. The non-conductive coupling member NCF may insulate each pair of adjacent pads PADpq from each other and may prevent or reduce the occurrence of a short circuit between each pair of adjacent pads PADpq. The non-conductive coupling member NCF may be located in the spaces between the pads PADpq in a plan view and may expose the pads PADpq. The non-conductive coupling member NCF may include an insulating resin having an adhesive characteristic.

Figure 4:
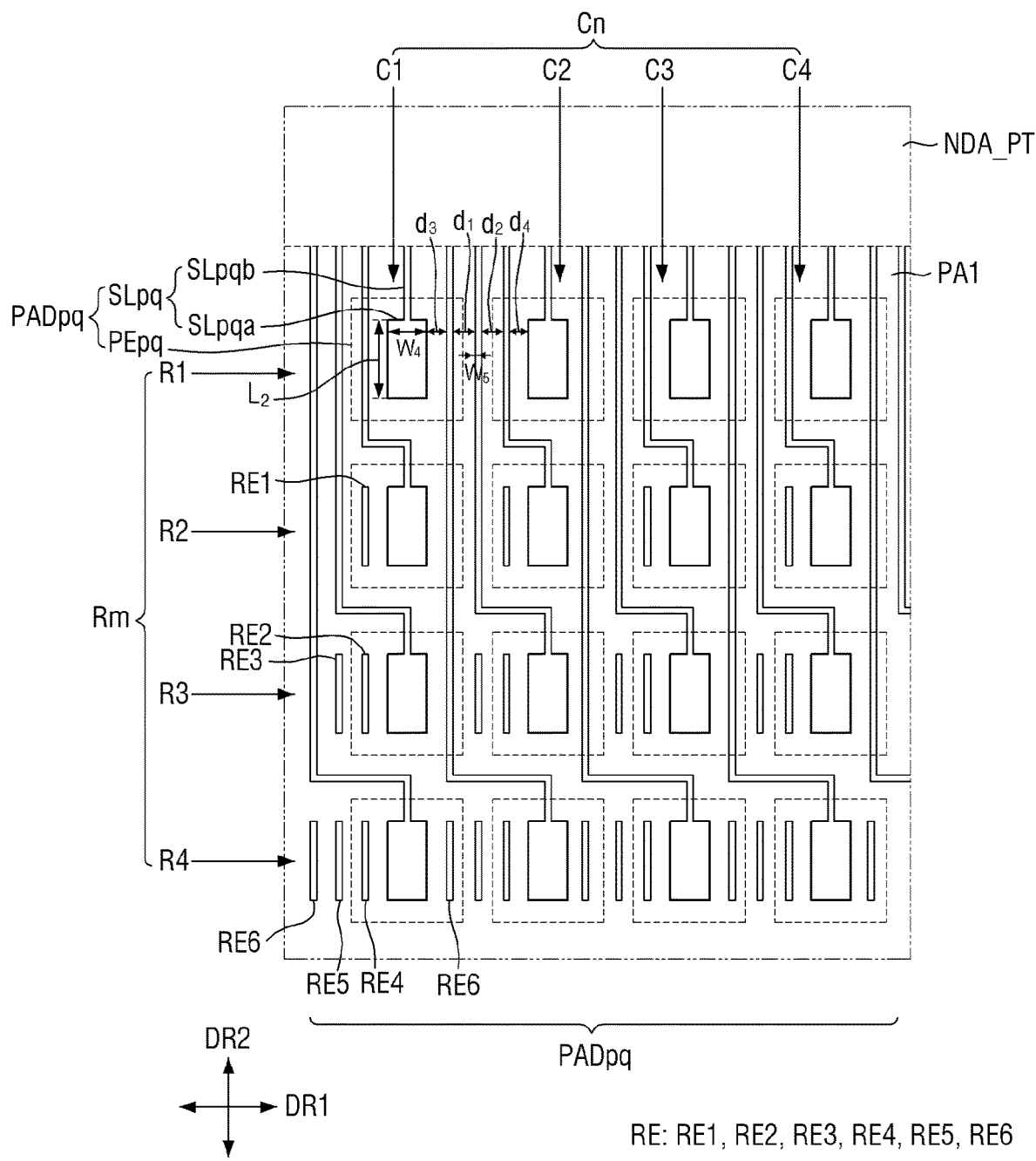
FIG. 4 is a layout view illustrating signal lines and dummy separation line parts according to some example embodiments of the present disclosure.

FIG. 4 is a layout view illustrating signal lines and dummy separation line parts according to some example embodiments of the present disclosure.

Referring to FIG. 4, the signal lines SL and pad electrodes PE will hereinafter be referred to by SLpq and PEpq, respectively, in consideration of their relationships with the pads PADpq that they are connected to. The pad electrodes PEpq may have a greater size than pad contact parts SLpqa in a plan view. The pad electrodes PEpq may completely cover the pad contact parts SLpqa in a plan view. Thus, the planar shape of each of the pads PADpq may be formed by the outer profile of each of the pad electrodes PEpq, and the pads PADpq may have the same shape and size as the pad electrodes PEpq in a plan view. The arrangement of the pads PADpq in the rows Rm and the columns Cn may directly apply to the pad electrodes PEpq.

The signal lines SLpq may include a (1,1)-th signal line SL11, which corresponds to the (1,1)-th pad PAD11, a (1,2)-th signal line SL12, which corresponds to the (1,2)-th pad PAD12, a (1,3)-th signal line SL13, which corresponds to the (1,3)-th pad PAD13, a (1,4)-th signal line SL14, which corresponds to the (1,4)-th pad PAD14, a (2,1)-th signal line SL21, which corresponds to the (2,1)-th pad PAD21, a (2,2)-th signal line SL22, which corresponds to the (2,2)-th pad PAD22, a (2,3)-th signal line SL23, which corresponds to the (2,3)-th pad PAD23, a (2,4)-th signal line SL24, which corresponds to the (2,4)-th pad PAD24, a (3,1)-th signal line SL31, which corresponds to the (3,1)-th pad PAD31, a (3,2)-th signal line SL32, which corresponds to the (3,2)-th pad PAD32, a (3,3)-th signal line SL33, which corresponds to the (3,3)-th pad PAD33, a (3,4)-th signal line SL34, which corresponds to the (3,4)-th pad PAD34, a (4,1)-th signal line SL41, which corresponds to the (4,1)-th pad PAD41, a (4,2)-th signal line SL42, which corresponds to the (4,2)-th pad PAD42, a (4,3)-th signal line SL43, which corresponds to the (4,3)-th pad PAD43, and a (4,4)-th signal line SL44, which corresponds to the (4,4)-th pad PAD44. The pad electrodes PEpq may include a (1,1)-th pad electrode PE11, which corresponds to the (1,1)-th pad PAD11, a (1,2)-th pad electrode PE12, which corresponds to the (1,2)-th pad PAD12, a (1,3)-th pad electrode PE13, which corresponds to the (1,3)-th pad PAD13, a (1,4)-th pad electrode PE14, which corresponds to the (1,4)-th pad PAD14, a (2,1)-th pad electrode PE21, which corresponds to the (2,1)-th pad PAD21, a (2,2)-th pad electrode PE22, which corresponds to the (2,2)-th pad PAD22, a (2,3)-th pad electrode PE23, which corresponds to the (2,3)-th pad PAD23, a (2,4)-th pad electrode PE24, which corresponds to the (2,4)-th pad PAD24, a (3,1)-th pad electrode PE31, which corresponds to the (3,1)-th pad PAD31, a (3,2)-th pad electrode PE32, which corresponds to the (3,2)-th pad PAD32, a (3,3)-th pad electrode PE33, which corresponds to the (3,3)-th pad PAD33, a (3,4)-th pad electrode PE34, which corresponds to the (3,4)-th pad PAD34, a (4,1)-th pad electrode PE41, which corresponds to the (4,1)-th pad PAD41, a (4,2)-th pad electrode PE42, which corresponds to the (4,2)-th pad PAD42, a (4,3)-th pad electrode PE43, which corresponds to the (4,3)-th pad PAD43, and a (4,4)-th pad electrode PE44, which corresponds to the (4,4)-th pad PAD44.

The signal lines SLpq may be electrically isolated from one another.

Dummy separation line parts RE, which are separate from the signal lines SLpq, may be further located in the first pad area PA1. The dummy separation line parts RE may include first, second, third, fourth, fifth, and sixth dummy separation line parts RE1, RE2, RE3, RE4, RE5, and RE6.

The signal lines SLpq may include the pad contact parts SLpqa, which are directly connected to the pads PADpq, and line parts SLpqb, which are connected to the pad contact parts SLpqa to extend toward the display area DA. A width $W_4$ of the pad contact parts SLpqa may be greater than a width $W_5$ of the dummy separation line parts RE. The width $W_5$ of the dummy separation line parts RE may be the same as the width of the dummy separation line parts RE. The pad contact parts SLpqa may have a second length $L_2$ in the second direction DR2, and the second length $L_2$ may be smaller than the first length $L_1$ of the pads PADpq.

The pad contact parts SLpqa and the line parts SLpqb may be arranged at equal intervals in the direction of the rows Rm. For example, referring to the first row R1, a (4,2)-th line part SL42b and a (3,2)-th line part SL32b may be a first distance $d_1$ apart from each other in the first direction DR1, the (3,2)-th line part SL32b and a (2,2)-th line part SL22b may be a second distance $d_2$ apart from each other in the first direction DR1, a (1,1)-th pad contact part SL11a and the (4,2)-th line part SL42b may be a third distance $d_3$ apart from each other in the first direction DR1, and the (2,2)-th line part SL22b and a (1,2)-th pad contact part SL12a may be a fourth distance $d_4$ apart from each other in the first direction DR1. The first, second, third, and fourth distances $d_1$, $d_2$, $d_3$, and $d_4$ may all be the same.

The pads PADpq may have protrusions on the surfaces thereof, in areas that overlap with the pad contact parts SLpqa and the line parts SLpqb in the thickness direction. Because the pad contact parts SLpqa and the line parts SLpqb are arranged at equal intervals, protrusions may be formed at equal intervals on the surfaces of the pads PADpq.

Each of the pad electrodes PEpq of the pads PADpq may overlap, in a thickness direction, with first- and second-side patterns of a pad contact part SLpqa, which are located on first and second sides, respectively, in the first direction DR1, of the pad contact part SLpqa. The first- and second-side patterns may include (or consist of) line parts SLpqb or dummy separation line parts RE. In a case where the first- and second-side patterns include (or consist of) line parts SLpqb, the line parts SLpqb may be electrically isolated from the pad contact part SLpqa.

Also, in a case where the first- and second-side patterns include (or consist of) dummy separation line parts RE, the dummy separation line parts RE may be electrically isolated from the pad contact part SLpqa. The dummy separation line parts RE may be floating electrodes that are separate from neighboring signal lines SL. In this manner, the first- and second-side patterns may be electrically isolated from the pad electrode PEpq arranged thereabove. The first- and second-side patterns may be electrically isolated from the pad electrode PEpq arranged thereabove, via an insulating layer. The insulating layer may be interposed between the first- and second-side patterns, the pad contact part SLpqa, and the pad electrode PEpq corresponding to the pad contact part SLpqa. The pad contact part SLpqa and the pad electrode PEpq corresponding to the pad contact part SLpqa may be electrically connected to via a contact hole of the insulating layer, but the first- and second-side patterns may be insulated from the pad electrode PEpq corresponding to the pad contact part SLpqa. Because the first- and second-side patterns are insulated from the pad electrode PEpq corresponding to the pad contact part SLpqa, the first- and second-side patterns may be referred to as first and second non-contact patterns, respectively.

Alternatively, one of the first- and second-side patterns may include (or consist of) a dummy branch line part (see RE1a of FIG. 6) of a signal line SLpa. The dummy branch line part may be physically connected to a neighboring line part SLpqb. The dummy branch line part may be physically connected to a line part SLpqb electrically connected to the pad contact part SLpqa that overlaps with the pad electrode PEpq corresponding to the pad contact part SLpqa.

Figure 6:
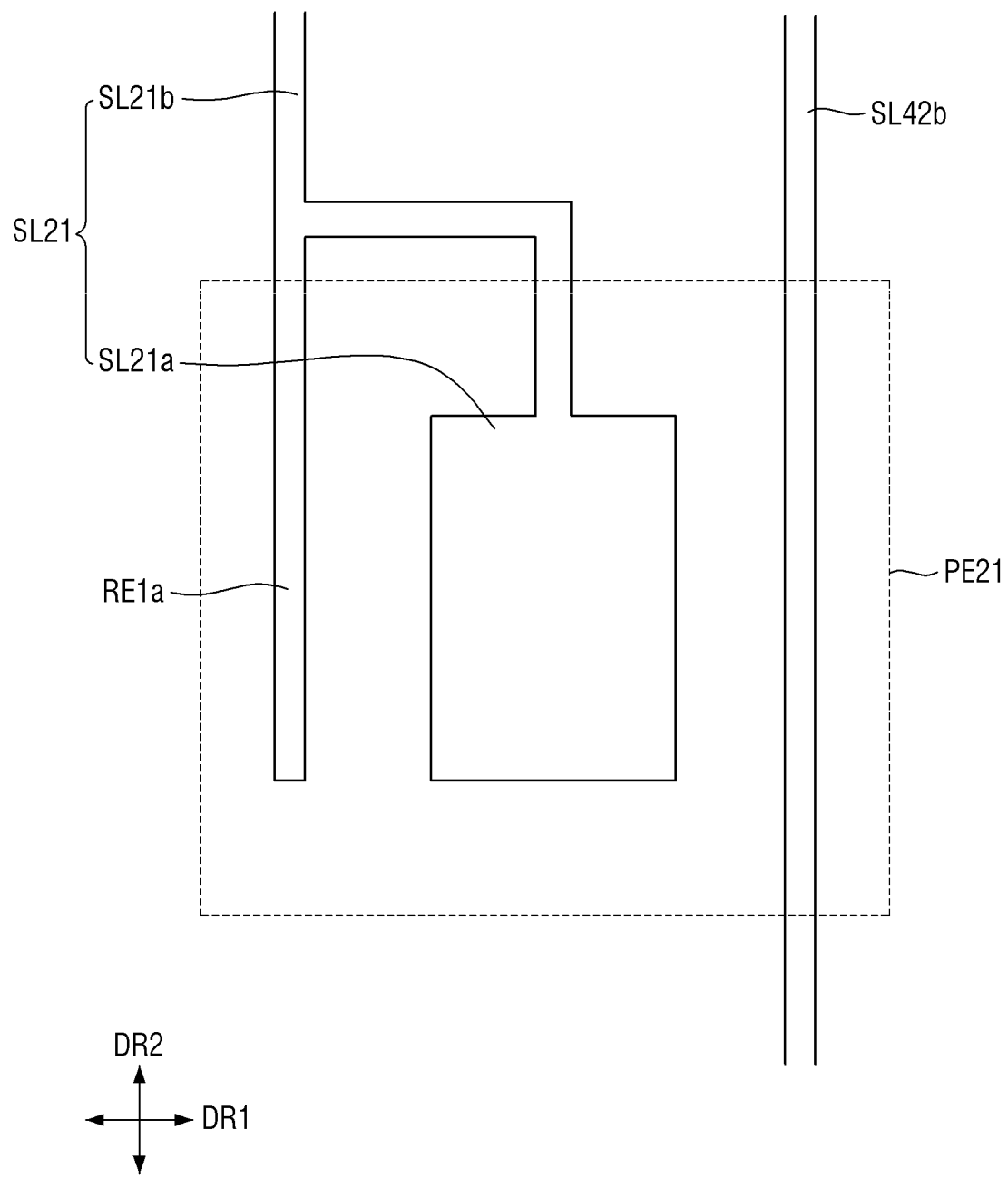
FIG. 6 is a layout view illustrating a modified example of FIG. 5A according to some example embodiments.

The first- and second-side patterns may include (or consist of) any one of combinations of line parts SLpqb that are electrically isolated from the pad contact part SLpqa and are located adjacent to the pad contact part SLpqa, dummy separation line parts RE, and a dummy branch line part (see RE1a of FIG. 6).

For example, the first- and second-side patterns may include (or consist of) a first combination of line parts SLpqb that are electrically isolated from, and located adjacent to, the pad contact part SLpqa, a second combination of dummy separation line parts RE, a third combination of a dummy separation line part RE and a line part SLpqb that is electrically isolated from, and located adjacent to, the pad contact part SLpqa, a fourth combination of a dummy branch line part RE1a that is connected to the pad contact part SLpqa and a line part SLpqb that is electrically isolated from, and located adjacent to, the pad contact part SLpqa, a fifth combination of a dummy separation line part RE and a dummy branch line part RE1a that is connected to the pad contact part SLpqa, and a sixth combination of dummy branch line parts RE1a that are connected to the pad contact part SLpqa.

In a case where one of the first- and second-side patterns includes (or consists of) a line part SLpqb that is electrically isolated from, and located adjacent to, the pad contact part SLpqa, one of the first- and second-side patterns may protrude outwardly beyond first- and second-side ends, in the second direction DR2, of the pad PADpq corresponding to the pad contact part SLpqa. In a case where one of the first- and second-side patterns includes (or consists of) a dummy separation line part RE that is electrically isolated from the pad contact part SLpqa, one of the first- and second-side patterns may be located on the inside of the first- and second-side ends, in the second direction DR2, of the pad PADpq corresponding to the pad contact part SLpqa. In a case where one of the first- and second-side patterns includes (or consists of) a dummy branch line part RE1a that is electrically connected to the pad contact part SLpqa, one of the first- and second-side patterns may protrude outwardly beyond one of the first- and second-side ends, in the second direction DR2, of the pad PADpq corresponding to the pad contact part SLpqa and may be located on the inside of the other end, in the second direction DR2, of the pad PADpq corresponding to the pad contact part SLpqa.

In a case where one of the first- and second-side patterns includes (or consists of) a line part SLpqb that is electrically isolated from, and located adjacent to, the pad contact part SLpqa, the length of one of the first- and second-side patterns is greater than the second length $L_2$ of the pad contact part SLpqa and may be the same as the first length $L_1$ of the pad PADpq corresponding to the pad contact part SLpqa. Also, in a case where one of the first- and second-side patterns includes (or consists of) a dummy separation line part RE that is electrically isolated from the pad contact part SLpqa, the length of one of the first- and second-side patterns may be smaller than the first length $L_1$ of the pad PADpq corresponding to the pad contact part SLpqa.

In a case where the first- and second-side patterns include (or consist of) the first combination, the first- and second-side patterns may both protrude outwardly beyond the first- and second-side ends, in the second direction DR2, of the pad PADpq corresponding to the pad contact part SLpqa, and the length of the first- and second-side patterns may be greater than the second length $L_2$ of the pad contact part SLpqa and may be the same as the first length $L_1$ of the pad PADpq corresponding to the pad contact part SLpqa.

In a case where the first- and second-side patterns include (or consist of) the second combination, the first- and second-side patterns may both be located on the inside of the first- and second-side ends, in the second direction DR2, of the pad PADpq corresponding to the pad contact part SLpqa, and the length of the first- and second-side patterns may be smaller than the first length $L_1$ of the pad PADpq corresponding to the pad contact part SLpqa.

In a case where the first- and second-side patterns include (or consist of) the third combination, one of the first- and second-side patterns may be located on the inside of the first- and second-side ends, in the second direction DR2, of the pad PADpq corresponding to the pad contact part SLpqa, and the other pattern may protrude outwardly beyond the first- and second-side ends, in the second direction DR2, of the pad PADpq corresponding to the pad contact part SLpqa. The length of one of the first- and second-side patterns may be smaller than the first length $L_1$ of the pad PADpq corresponding to the pad contact part SLpqa, and the length of the other pattern may be greater than the second length $L_2$ of the pad contact part SLpqa and may be the same as the first length $L_1$ of the pad PADpq corresponding to the pad contact part SLpqa.

In a case where the first- and second-side patterns include (or consist of) the fourth combination, one of the first- and second-side patterns may protrude outwardly one of the first- and second-side ends, in the second direction DR2, of the pad PADpq corresponding to the pad contact part SLpqa and may be located on the inside of the other end, in the second direction DR2, of the pad PADpq corresponding to the pad contact part SLpqa. The other pattern may protrude outwardly beyond the first- and second-side ends, in the second direction DR2, of the pad PADpq corresponding to the pad contact part SLpqa, and the length of the other pattern may be greater than the second length $L_2$ of the pad contact part SLpqa and may be the same as the first length $L_1$ of the pad PADpq corresponding to the pad contact part SLpqa.

In a case where the first- and second-side patterns include (or consist of) the fifth combination, one of the first- and second-side patterns may protrude outwardly one of the first- and second-side ends, in the second direction DR2, of the pad PADpq corresponding to the pad contact part SLpqa and may be located on the inside of the other end, in the second direction DR2, of the pad PADpq corresponding to the pad contact part SLpqa. The other pattern may be located on the inside of the first- and second-side ends, in the second direction DR2, of the pad PADpq corresponding to the pad contact part SLpqa, and the length of the other pattern may be smaller than the first length $L_1$ of the pad PADpq corresponding to the pad contact part SLpqa.

In a case where the first- and second-side patterns include (or consist of) the sixth combination, the first- and second-side patterns may both protrude outwardly beyond one of the first- and second-side ends, in the second direction DR2, of the pad PADpq corresponding to the pad contact part SLpqa and may be located on the onside of the other end, in the second direction DR2, of the pad PADpq corresponding to the pad contact part SLpqa.

Figure 5A:
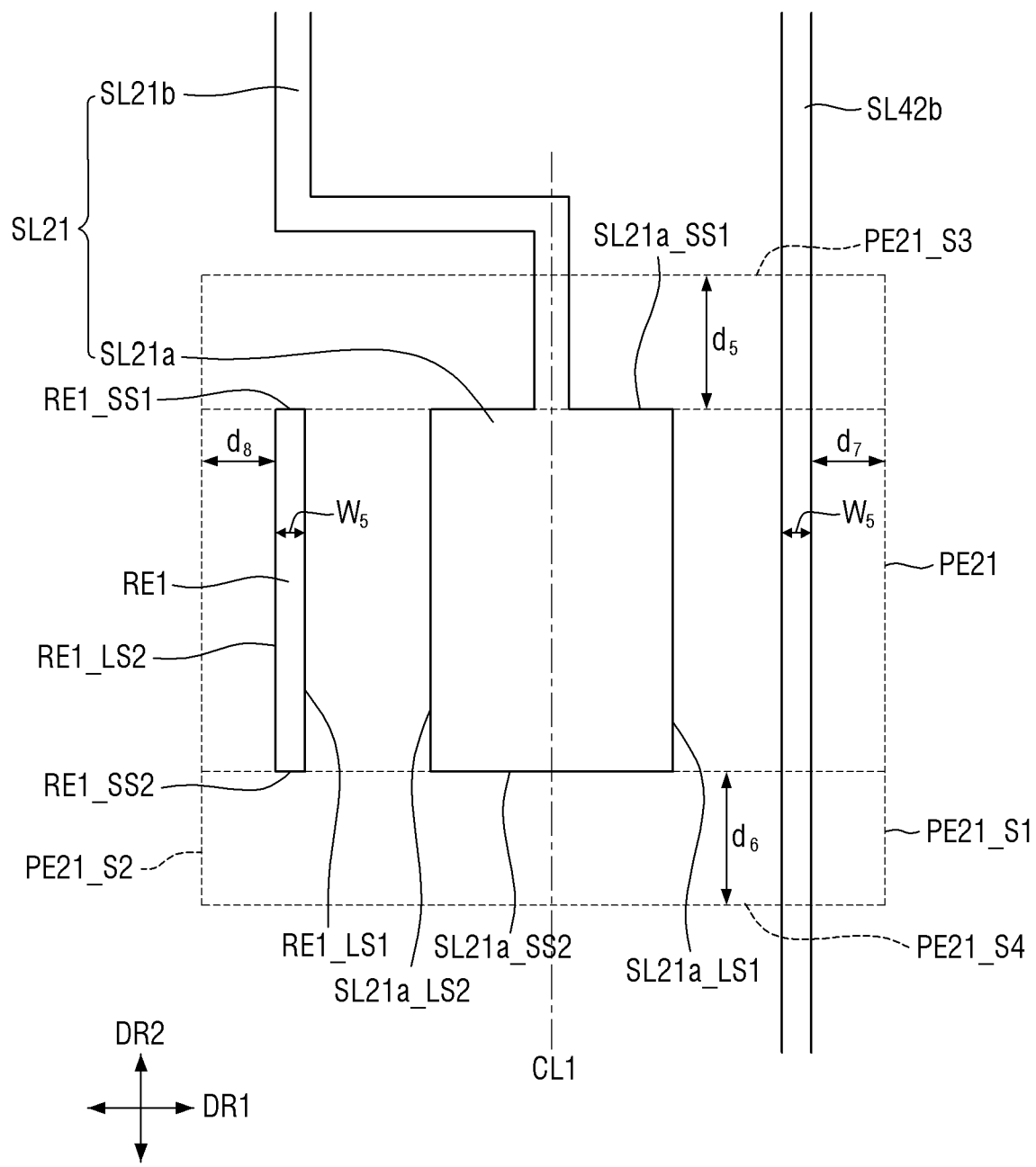
FIG. 5A is a layout view illustrating a (2,1)-th pad electrode, a (2,1)-th signal line, a first dummy separation line part, and a (4,2)-th line part of FIG. 4 according to some example embodiments.

FIG. 5A is a layout view illustrating the (2,1)-th pad electrode, the (2,1)-th signal line, the first dummy separation line part, and the (4,2)-th line part of FIG. 4.

FIG. 5A illustrates a case where first- and second-side patterns of a pad contact part SLpqa include (or consist of) the third combination, i.e., a combination of a dummy separation line part RE and a line part SLpqb that is electrically isolated from a pad contact part SLpqa.

FIG. 5A illustrates sides of the (2,1)-th pad electrode PE21, sides of a (2,1)-th pad contact part SL21a, and sides of the first dummy separation line part RE1. The (2,1)-th pad electrode PE21 may include a first pad electrode side PE21_S1, which extends in the second direction DR2 and is arranged on a first side, in the first direction DR1, of the (2,1)-th pad electrode PE21, a second pad electrode side PE21_S2, which extends in the second direction DR2, is arranged on a second side, in the first direction DR1, of the (2,1)-th pad electrode PE21, and faces the first pad electrode side PE21_S1, a third pad electrode side PE21_S3, which extends in the first direction DR1 and is arranged on a first side, in the second direction DR2, of the (2,1)-th pad electrode PE21, and a fourth pad electrode side PE21_S3, which extends in the first direction DR1, is arranged on a second side, in the second direction DR2, of the (2,1)-th pad electrode PE21, and faces the third pad electrode side PE21_S3; the (2,1)-th pad contact part SL21a may include a first pad contact part long side SL21a_LS1, which extends in the second direction DR2 and is located on a first side, in the first direction DR1, of the (2,1)-th pad contact part SL21a, a second pad contact part long side SL21a_LS2, which extends in the second direction DR2, is located on a second side, in the first direction DR1, of the (2,1)-th pad contact part SL21a, and faces the first pad contact part long side SL21a_LS1, a first pad contact part short side SL21a_SS1, which extends in the first direction DR1 and is located on a first side, in the second direction DR2, of the (2,1)-th pad contact part SL21a, and a second pad contact part short side SL21a_SS2, which extends in the first direction DR1, is located on a second side, in the second direction DR2, of the (2,1)-th pad contact part SL21a, and faces the first pad contact part short side SL21a_SS1; and the first dummy separation line part RE1 may include a first dummy separation line part long side RE1_LS1, which extends in the second direction DR2 and is arranged on a first side, in the first direction DR1, of the first dummy separation line part RE1, a second dummy separation line part long side RE1_LS2, which extends in the second direction DR2, is arranged on a second side, in the first direction DR1, of the first dummy separation line part RE1, and faces the first dummy separation line part long side RE1_LS1, a first dummy separation line part short side RE1_SS1, which extends in the first direction DR1 and is arranged on a first side, in the second direction DR2, of the first dummy separation line part RE1, and a second dummy separation line part short side RE1_SS2, which extends in the first direction DR1, is arranged on a second side, in the second direction DR2, of the first dummy separation line part RE1, and faces the first dummy separation line part short side RE1_SS1.

Referring to FIG. 5A, the (2,1)-th pad electrode PE21 may correspond to the (2,1)-th signal line SL21. The (2,1)-th pad electrode PE21 may be arranged to generally overlap with the (2,1)-th pad contact part SL21a in the thickness direction. The (2,1)-th line part SL21b may extend from the (2,1)-th pad contact part SL21a in a direction toward the first side, in the second direction DR2, of the (2,1)-th signal line SL21, may be bent in a direction toward the second side, in the first direction DR1, of the (2,1)-th signal line SL21, and may extend in a direction toward the first side, in the second direction DR2, of the (2,1)-th signal line SL21 and may thus form the second-side pattern of the (1,1)-th pad electrode PE11. Part of the (2,1)-th line part SL21b may overlap with the (2,1)-th pad electrode PE21 in the thickness direction.

The (4,2)-th line part SL42b may be arranged on the first side, in the first direction DR1, of the (2,1)-th pad contact part SL21a, and the first dummy separation line part RE1 may be arranged on the second side, in the first direction DR1, of the (2,1)-th pad contact part SL21a.

The first-side pattern of the (2,1)-th pad electrode PE21 may be the (4,2)-th line part SL42b, and the second-side pattern of the (2,1)-th pad electrode PE21 may be the first dummy separation line part RE1. The (4,2)-th line part SL42b and the first dummy separation line part RE1 may be electrically isolated from each other. The first dummy separation line part RE1 may be aligned with the (2,1)-th line part SL21b in the second direction DR2.

A seventh distance $d_7$ between the (4,2)-th line part SL42b and the first pad electrode side PE21_S1 of the (2,1)-th pad electrode PE21 may be the same as an eighth distance $d_8$ between the second dummy separation line part long side RE1_LS2 of the first dummy separation line part RE1 and the second pad electrode side PE21_S2 of the (2,1)-th pad electrode PE21. That is, the first dummy separation line part RE1, which is the second-side pattern of the (2,1)-th pad electrode PE21, and the (4,2)-th line part SL42b, which is the first-side pattern of the first dummy separation line part RE1, may be arranged symmetrically with respect to a first reference line CL1, which extends in the second direction DR2 to divide the (2,1)-th pad electrode PE21 in two halves in the first direction DR1. The first reference line CL1 may be an imaginary line dividing the (2,1)-th pad electrode PE21 in two halves in the first direction DR1.

The (2,1)-th pad electrode PE21 may include protrusions on the surface thereof in areas that overlap with the first dummy separation line part RE1 and the (4,2)-th line part SL42b in the thickness direction. Because the protrusions of the (2,1)-th pad electrode PE21 that are formed by the first dummy separation line part RE1 and the (4,2)-th line part SL42b are symmetrical with respect to the first reference line CL1, bonding reliability between the (2,1)-th pad electrode PE21 and the driving member D_IC can be secured.

The first pad contact part short side SL21a_SS1 of the (2,1)-th pad contact part SL21a and the first dummy separation line part short side RE1_SS1 of the first dummy separation line part RE1 may be aligned with each other in the first direction DR1 to form a third extension line, and the second pad contact part short side SL21a_SS2 of the (2,1)-th pad contact part SL21a and the second dummy separation line part short side RE1_SS2 of the first dummy separation line part RE1 may be aligned with each other in the first direction DR1 to form a fourth extension line. A fifth distance $d_5$ between the third extension line and the third pad electrode side PE21_S3 may be the same as a sixth distance $d_6$ between the fourth extension line and the fourth pad electrode side PE21_S4.

The length, in the second direction DR2, of the first dummy separation line part RE1 may vary.

Figure 5B:
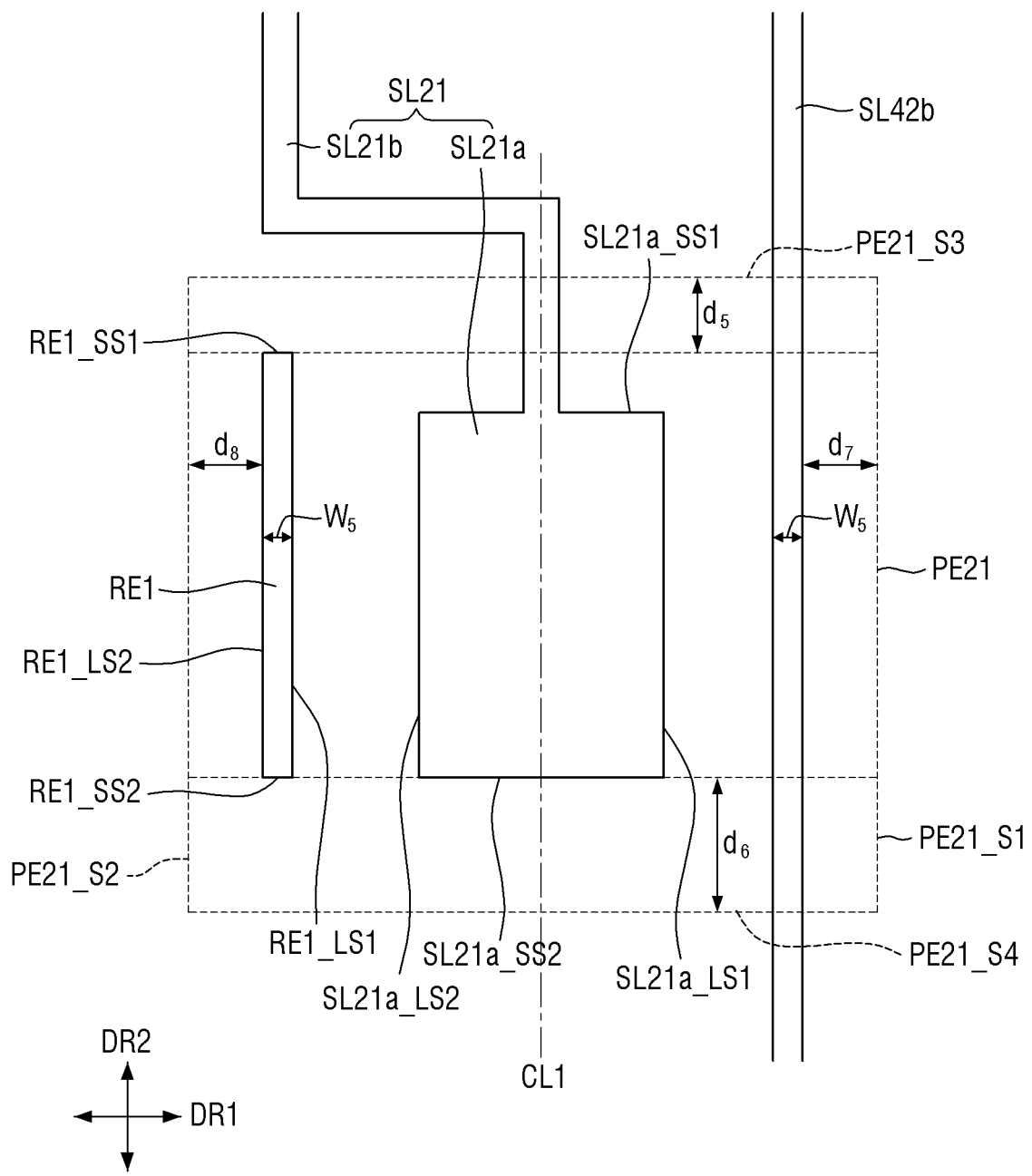
FIG. 5B is a layout view illustrating a modified example of FIG. 5A according to some example embodiments.
Figure 5C:
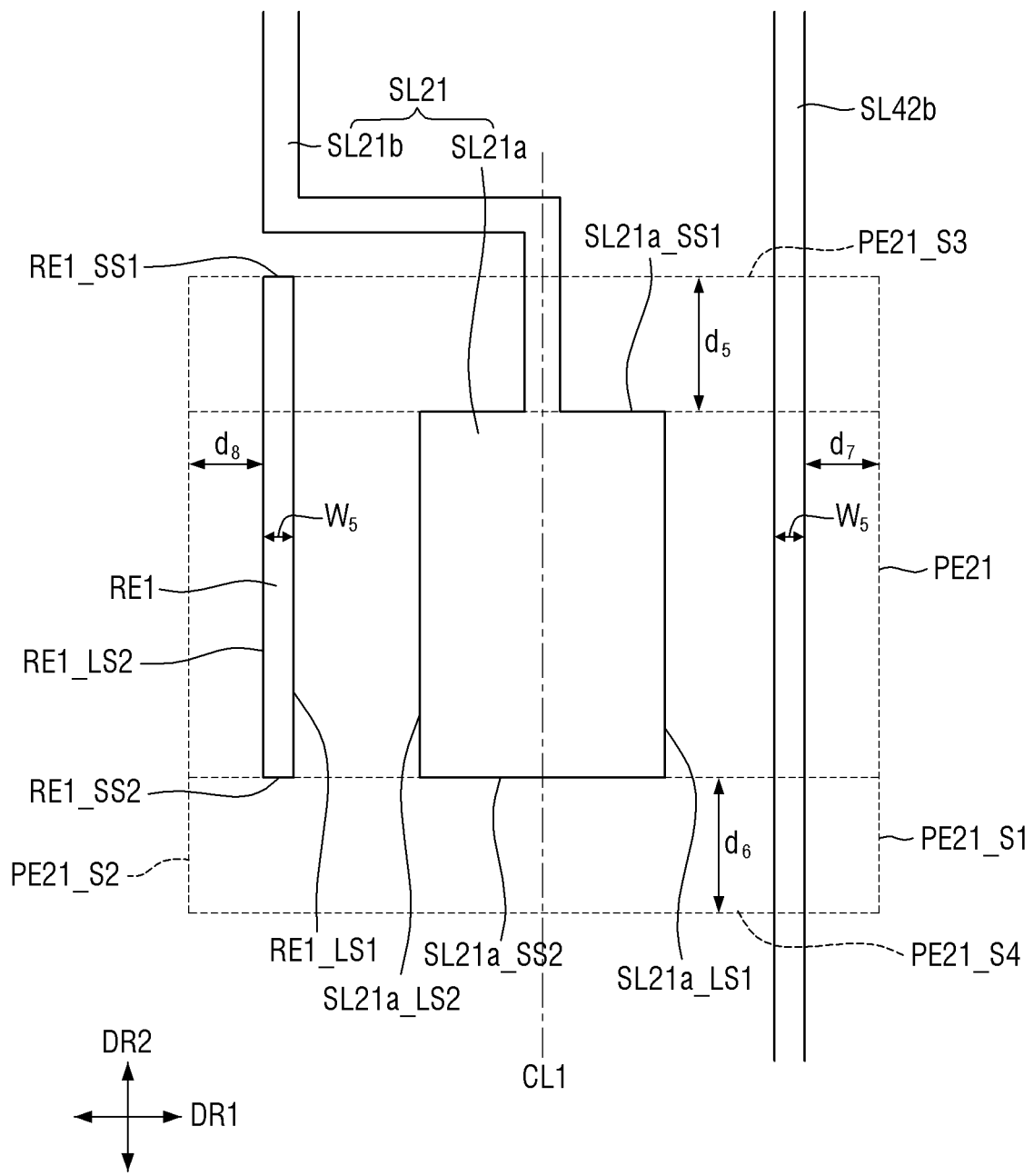
FIG. 5C is a layout view illustrating a modified example of FIG. 5A according to some example embodiments.
Figure 5D:
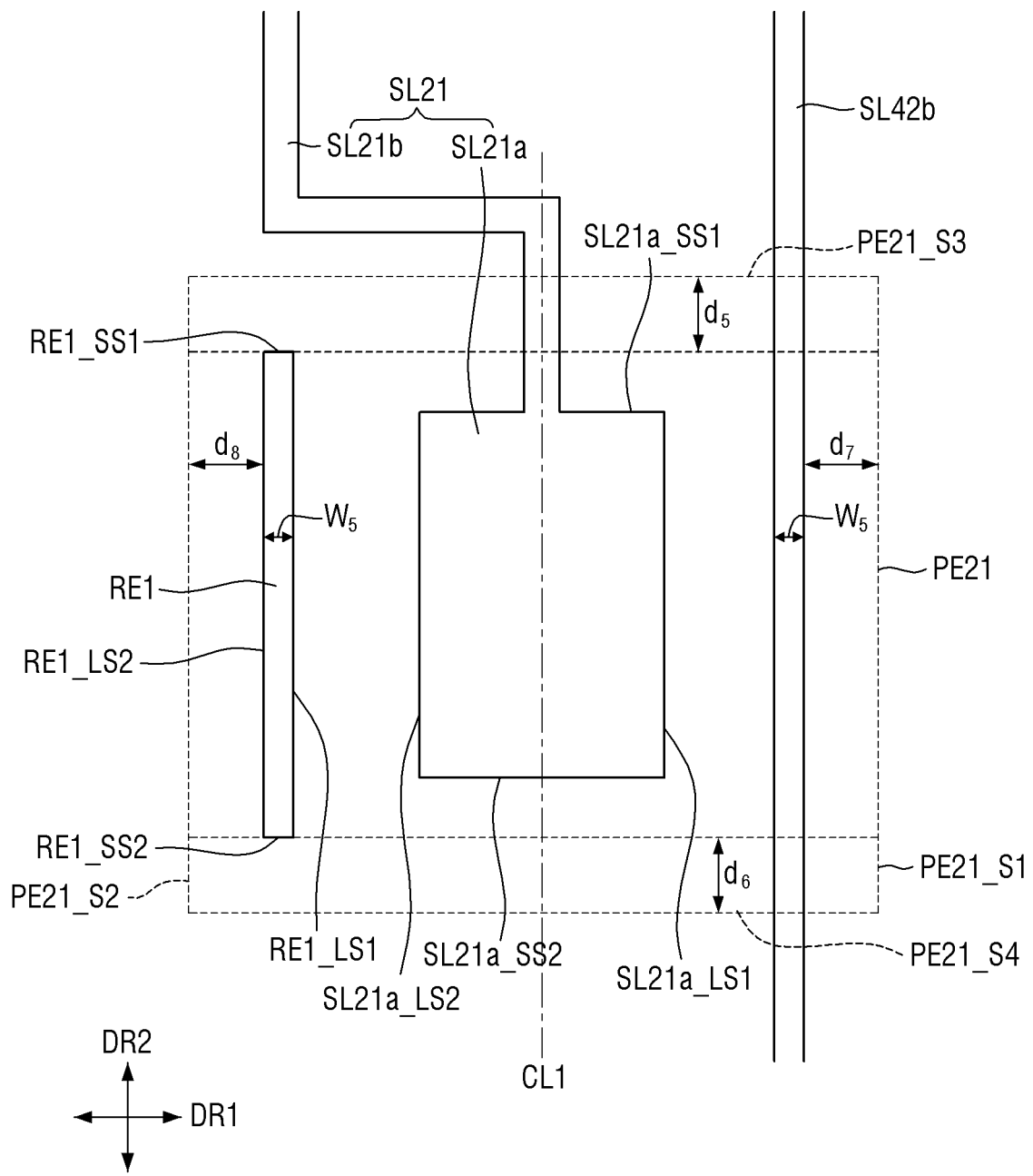
FIG. 5D is a layout view illustrating a modified example of FIG. 5A according to some example embodiments.
Figure 5E:
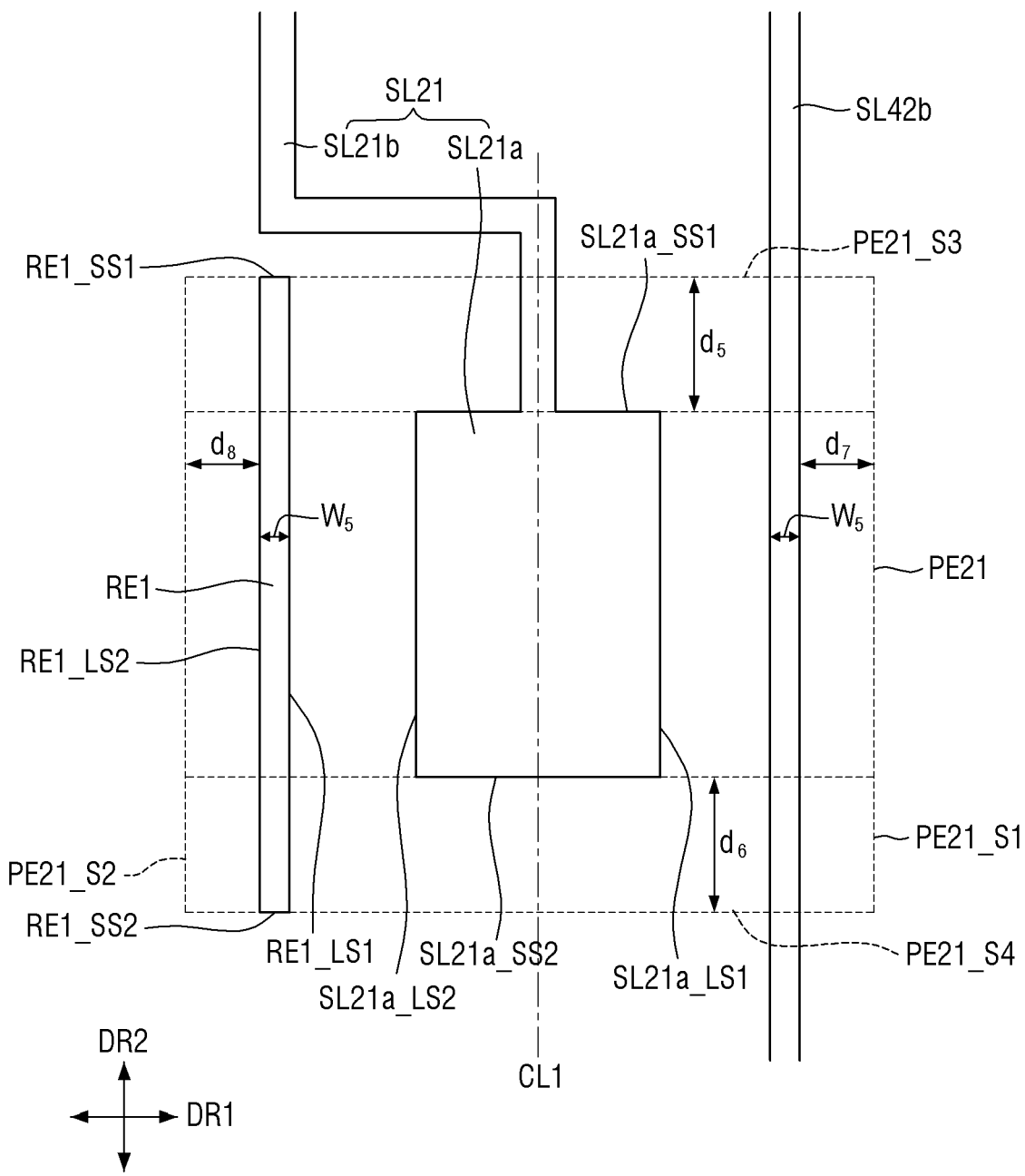
FIG. 5E is a layout view illustrating a modified example of FIG. 5A according to some example embodiments.
Figure 5F:
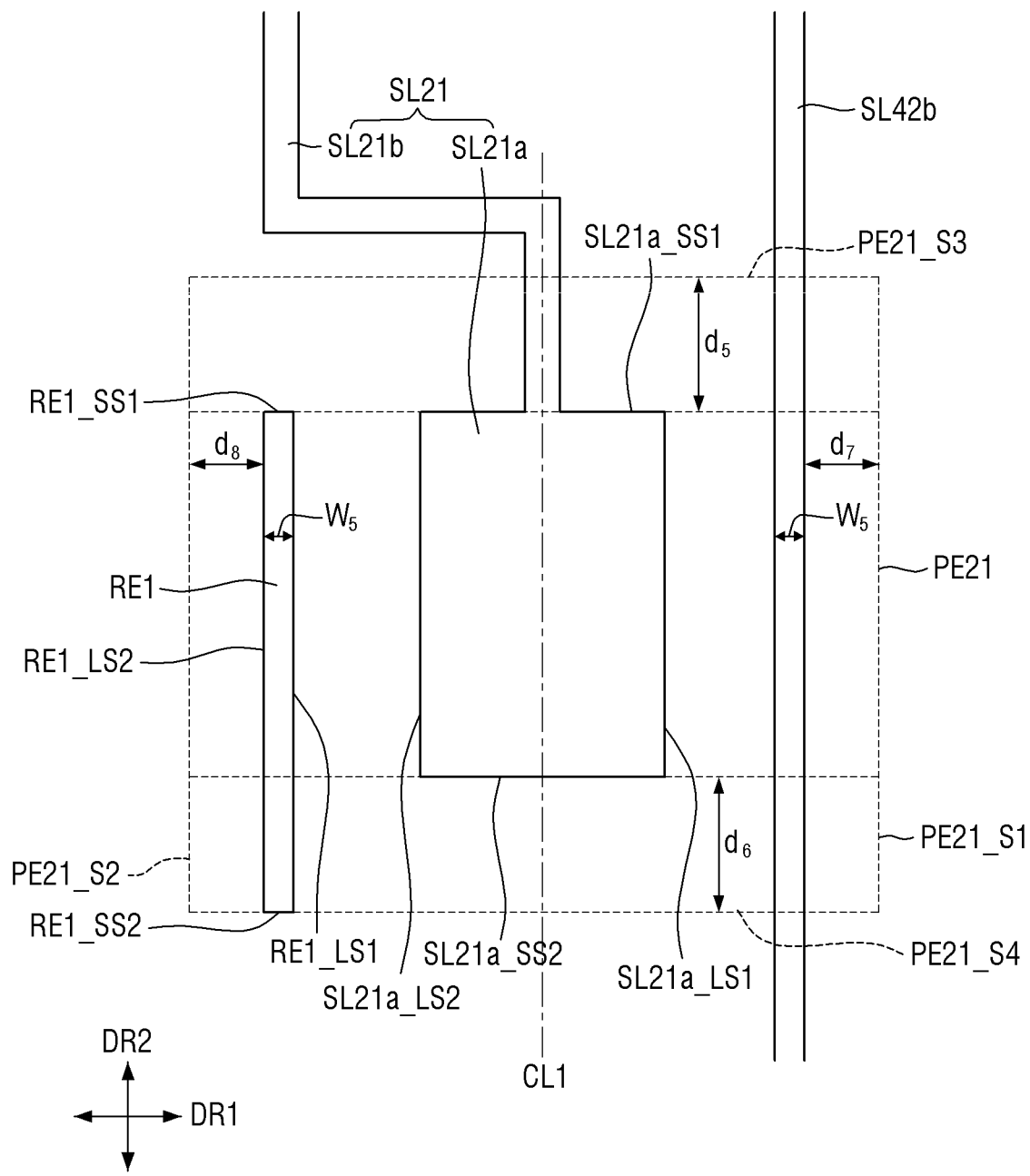
FIG. 5F is a layout view illustrating a modified example of FIG. 5A according to some example embodiments.
Figure 5G:
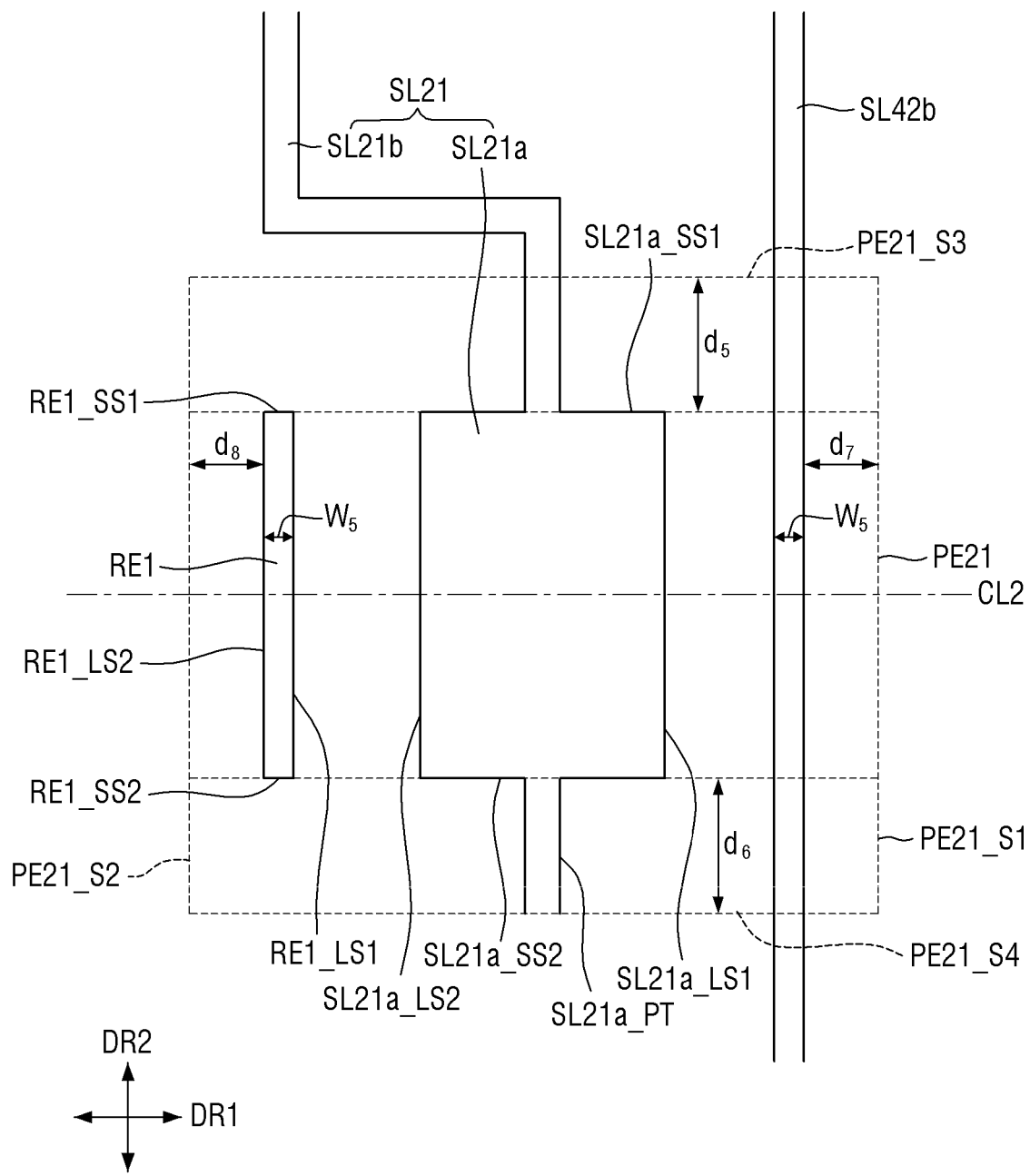
FIG. 5G is a layout view illustrating a modified example of FIG. 5A according to some example embodiments.

FIG. 5B is a layout view illustrating a modified example of FIG. 5A, FIG. 5C is a layout view illustrating a modified example of FIG. 5A, FIG. 5D is a layout view illustrating a modified example of FIG. 5A, FIG. 5E is a layout view illustrating a modified example of FIG. 5A, FIG. 5F is a layout view illustrating a modified example of FIG. 5A, and FIG. 5G is a layout view illustrating a modified example of FIG. 5A.

Referring to FIG. 5B, the embodiments described with respect to FIG. 5B differ from the embodiments described with respect to FIG. 5A in that a first dummy separation line part RE1 protrudes beyond a (2,1)-th pad contact part SL21a, on a first side, in the second direction DR2, of a (2,1)-th pad electrode PE21. A first dummy separation line part short side RE_SS1 of the first dummy separation line part RE1 may be arranged closer than a first pad contact part short side SL21a_SS1 to a third pad electrode side PE21_S3.

Referring to FIG. 5C, in the embodiments described with respect to FIG. 5C, like in the embodiments described with respect to FIG. 5B, a first dummy separation line part RE1 protrudes beyond a (2,1)-th pad contact part SL21a, on a first side, in the second direction DR2, of a (2,1)-th pad electrode PE21. However, in the embodiments described with respect to FIG. 5C, unlike in the embodiments described with respect to FIG. 5B, the first dummy separation line part RE1 further extends so that a first dummy separation line part short side RE1_SS1 is aligned with a first pad contact part short side SL21a_SS1 in the first direction DR1. In a plan view, the first dummy separation line part RE1 and a (4,2)-th line part SL42b may have the same area between an extension line from the first pad contact part short side SL21a_SS1 and a third pad electrode side PE21_S3 of the (2,1)-th pad electrode PE21. That is, the embodiments of FIGS. 5B and 5C show that in a plan view, the area of the first dummy separation line part RE1 can be controlled in a region between the extension line, in the first direction DR1, of the first pad contact part short side SL21a_SS1 and the third pad electrode side PE21_S3 of the (2,1)-th pad electrode PE21, and as a result, the areas of the first dummy separation line part RE1 and the (4,2)-th line part SL42b, which is symmetrical with the first dummy separation line part RE1 with respect to the first reference line CL1, can be balanced in the region between the extension line, in the first direction DR1, of the first pad contact part short side SL21a_SS1 and the third pad electrode side PE21_S3 of the (2,1)-th pad electrode PE21. Accordingly, bonding reliability can be further improved.

Referring to FIG. 5D, the embodiments described with respect to FIG. 5D differ from the embodiments described with respect to FIG. 5B in that a first dummy separation line part RE1 protrudes beyond a (2,1)-th pad contact part SL21a, on a second side, in the second direction DR2, of a (2,1)-th pad electrode PE21. A second dummy separation line part short side RE1_SS2 of the first dummy separation line part RE1 may be arranged closer than a second pad contact part short side SL21a_SS2 to a fourth pad electrode side PE21_S4.

Referring to FIG. 5E, the embodiments described with respect to FIG. 5E differ from the embodiments described with respect to FIG. 5C in that a first dummy separation line part RE1 protrudes beyond a (2,1)-th pad contact part SL21a, on a second side, in the second direction DR2, of a (2,1)-th pad electrode PE21, to be aligned with a second pad contact part short side SL21a_552 in the first direction DR1.

In a plan view, the first dummy separation line part RE1 and a (4,2)-th line part SL42b may have the same area between an extension line, in the first direction DR1, of the second pad contact part short side SL21a_552 and a fourth pad electrode side PE21_S4 of the (2,1)-th pad electrode PE21.

Referring to FIG. 5F, in the embodiments described with respect to FIG. 5F, like in the embodiments described with respect to FIG. 5E, the first dummy separation line part RE1 protrudes beyond the (2,1)-th pad contact part SL21a, on the second side, in the second direction DR2, of the (2,1)-th pad electrode PE21. However, in the embodiments described with respect to FIG. 5F, unlike in the embodiments described with respect to FIG. 5E, the first dummy separation line part short side RE1_SS1 is aligned with the first pad contact part short side SL21a_SS1 in the first direction DR1.

That is, the embodiments described with respect to FIGS. 5D, 5E, and 5F show that in a plan view, the area of the first dummy separation line part RE1 can be controlled in a region between the extension line, in the first direction DR1, of the second pad contact part short side SL21a_SS2 and the fourth pad electrode side PE21_S4 of the (2,1)-th pad electrode PE21, and as a result, the areas of the first dummy separation line part RE1 and the (4,2)-th line part SL42b, which is symmetrical with the first dummy separation line part RE1 with respect to the first reference line CL1, can be balanced in the region between the extension line, in the first direction DR1, of the second pad contact part short side SL21a_552 and the fourth pad electrode side PE21_S4 of the (2,1)-th pad electrode PE21. Accordingly, bonding reliability can be further improved.

Referring to FIG. 5G, the embodiments described with respect to FIG. 5G differ from the embodiments described with respect to FIG. 5A in that a line protrusion part SL21a_PT, which protrudes from a second pad contact part short side SL21a_SS2 of a (2,1)-th pad contact part SL21a, on a second side, in the second direction DR2, of a (2,1)-th pad electrode PE21, is further provided. The line protrusion part SL21a_PT may be directly connected to the second pad contact part short side SL21a_552. The width, in the first direction DR1, of the line protrusion part SL21a_PT may be the same as a width $W_5$, in the first direction DR1, of a (2,1)-th line part SL21b. The line protrusion part SL21a_PT may be arranged symmetrically with the (2,1)-th line part SL21b with respect to a second reference line CL2, which extends in the first direction DR1. The second reference line CL2 may be defined as an imaginary line extending in the first direction DR1 to divide a (2,1)-th pad contact part SL21a in two halves in the second direction DR2.

Because the line protrusion part SL21a_PT is further provided and is symmetrical with the (2,1)-th line part SL21b, bonding reliability can be further improved.

FIG. 6 is a layout view illustrating a modified example of FIG. 5A.

FIG. 6 illustrates a case where a case where first- and second-side patterns of a pad contact part SLpqa include (or consist of) the fourth combination, i.e., a combination of a line part SLpqb that is electrically isolated from a pad contact part SLpqa and a dummy branch line part RE1a that is connected to the pad contact part SLpqa.

Referring to FIG. 6, the embodiments described with respect to FIG. 6 differ from the embodiments described with respect to FIG. 5A in that a first dummy separation line part RE1 is replaced with a first dummy branch line part RE1a. The first dummy branch line part RE1a may be physically and electrically connected to a (2,1)-th line part SL21b, which is connected to a (2,1)-th pad contact part SL21a that overlaps with a (2,1)-th pad PAD21.

Figure 7A:
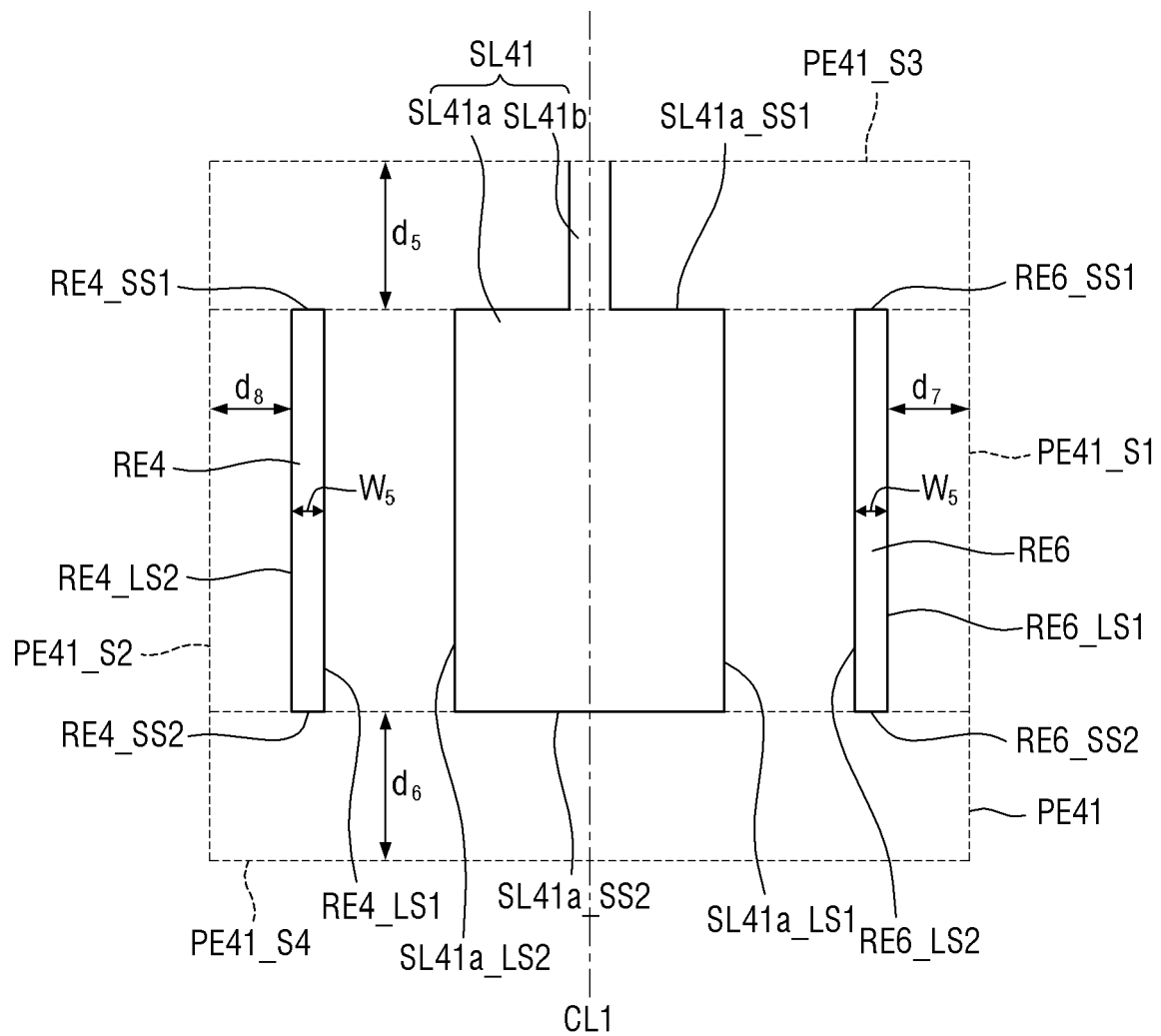
FIG. 7A is a layout view illustrating a (4,1)-th pad electrode, a (4,1)-th signal line, and fourth and sixth dummy separation line parts of FIG. 4 according to some example embodiments.

FIG. 7A is a layout view illustrating a (4,1)-th pad electrode, a (4,1)-th signal line, and fourth and sixth dummy separation line parts of FIG. 4.

FIG. 7A illustrates a case where first- and second-side patterns of a pad contact part SLpqa include (or consist of) the second combination, i.e., dummy separation line parts RE.

FIG. 7A illustrates sides of a (4,1)-th pad electrode PE41, sides of a (4,1)-th signal line SL41, sides of the fourth dummy separation line part RE4, and sides of the sixth dummy separation line part RE6. The (4,1)-th pad electrode PE41 may include a first pad electrode side PE41_S1, which extends in the second direction DR2 and is arranged on a first side, in the first direction DR1, of the (4,1)-th pad electrode PE41, a second pad electrode side PE41_S2, which extends in the second direction DR2, is arranged on a second side, in the first direction DR1, of the (4,1)-th pad electrode PE41, and faces the first pad electrode side PE41_S1, a third pad electrode side PE41_S3, which extends in the first direction DR1 and is located on a first side, in the second direction DR2, of the (4,1)-th pad electrode PE41, and a fourth pad electrode side PE41_S3, which extends in the first direction DR1, is located on a second side, in the second direction DR2, of the (4,1)-th pad electrode PE41, and faces the third pad electrode side PE41_S3; a (4,1)-th pad contact part SL41a may include a first pad contact part long side SL41a_LS1, which extends in the second direction DR2 and is located on a first side, in the first direction DR1, of the (4,1)-th pad contact part SL41a, a second pad contact part long side SL41a_LS2, which extends in the second direction DR2, is located on a second side, in the first direction DR1, of the (4,1)-th pad contact part SL41a, and faces the first pad contact part long side SL41a_LS1, a first pad contact part short side SL41a_SS1, which extends in the first direction DR1 and is located on a first side, in the second direction DR2, of the (4,1)-th pad contact part SL41a, and a second pad contact part short side SL41a_SS2, which extends in the first direction DR1, is located on a second side, in the second direction DR2, of the (4,1)-th pad contact part SL41a, and faces the first pad contact part short side SL41a_SS1; the fourth and sixth dummy separation line parts RE4 and RE6 may include first dummy separation line part long sides RE4_LS1 and RE6_LS1, respectively, which extend in the second direction DR2 and are located on first sides, in the first direction DR1, of the fourth and sixth dummy separation line parts RE4 and RE6, respectively, second dummy separation line part long sides RE4_LS2 and RE6_LS2, respectively, which extend in the second direction DR2, are located on second sides, in the first direction DR1, of the fourth and sixth dummy separation line parts RE4 and RE6, respectively, and face the first dummy separation line part long sides RE4_LS1 and RE6_LS1, respectively, first dummy separation line part short sides RE4_SS1 and RE6_SS1, respectively, which extend in the first direction DR1 and are located on first sides, in the second direction DR2, of the fourth and sixth dummy separation line parts RE4 and RE6, respectively, and second dummy separation line part short sides RE4_SS2 and RE6_SS2, which extend in the first direction DR1, are located on second sides, in the second direction DR2, of the fourth and sixth dummy separation line parts RE4 and RE6, respectively, and face the first dummy separation line part short sides RE4_SS1 and RE6_SS1, respectively.

Referring to FIG. 7A, the (4,1)-th pad electrode PE41 may correspond to the (4,1)-th signal line SL41. The (4,1)-th pad electrode PE41 may be arranged to generally overlap with the (4,1)_th pad contact part SL41a of the (4,1)-th signal line SL41 in the thickness direction.

The sixth dummy separation line part RE6 may be located on a first side, in the first direction DR1, of the (4,1)-th pad contact part SL41a, and the fourth dummy separation line part RE4 may be located on a second side, in the first direction DR1, of the (4,1)-th pad contact part SL41a.

The first-side pattern of the (4,1)-th pad electrode PE41 may be the sixth dummy separation line part RE6, and the second-side pattern of the (4,1)-th pad electrode PE41 may be the fourth dummy separation line part RE4. The fourth and sixth dummy separation line parts RE4 and RE6 may be electrically isolated.

The seventh distance $d_7$ between the sixth dummy separation line part RE6 and the first pad electrode side PE41_S1 of the (4,1)-th pad electrode PE41 may be the same as the eighth distance $d_8$ between the fourth dummy separation line part RE4 and the second pad electrode side PE41_S2 of the (4,1)-th pad electrode PE41. That is, the fourth and sixth dummy separation line parts RE4 and RE6, which are second- and first-side patterns, respectively, of the (4,1)-th pad electrode PE41, may be arranged symmetrically with respect to the first reference line CL1, which extends in the second direction DR2. Accordingly, the (4,1)-th pad electrode PE41 may include protrusions on the surface thereof in areas that overlap with the fourth and sixth dummy separation line parts RE4 and RE6 in the thickness direction. Because the protrusions of the (4,1)-th pad electrode PE41 that are formed by the fourth and sixth dummy separation line parts RE4 and RE6 are symmetrical with respect to the first reference line CL1, bonding reliability between the (4,1)-th pad electrode PE41 and the driving member D_IC can be secured.

The first pad contact part short side SL41a_SS1 of the (4,1)-th pad contact part SL41a and the first dummy separation line part short sides RE4_SS1 and RE6_SS1 may be aligned with one another in the first direction DR1 to form a third extension line, and the second pad contact part short side SL41a_SS2 of the (4,1)-th pad contact part SL41a and the second dummy separation line part short sides RE4_SS2 and RE6_SS2 may be aligned with one another in the first direction DR1 to form a fourth extension line. The fifth distance $d_5$ between the third extension line and the first pad contact part short side SL41a_SS1 may be the same as a sixth distance $d_6$ between the fourth extension line and the second pad contact part short side SL41a_SS2.

The lengths, in the second direction DR2, of the fourth and sixth dummy separation line parts RE4 and RE6 may vary.

Figure 7B:
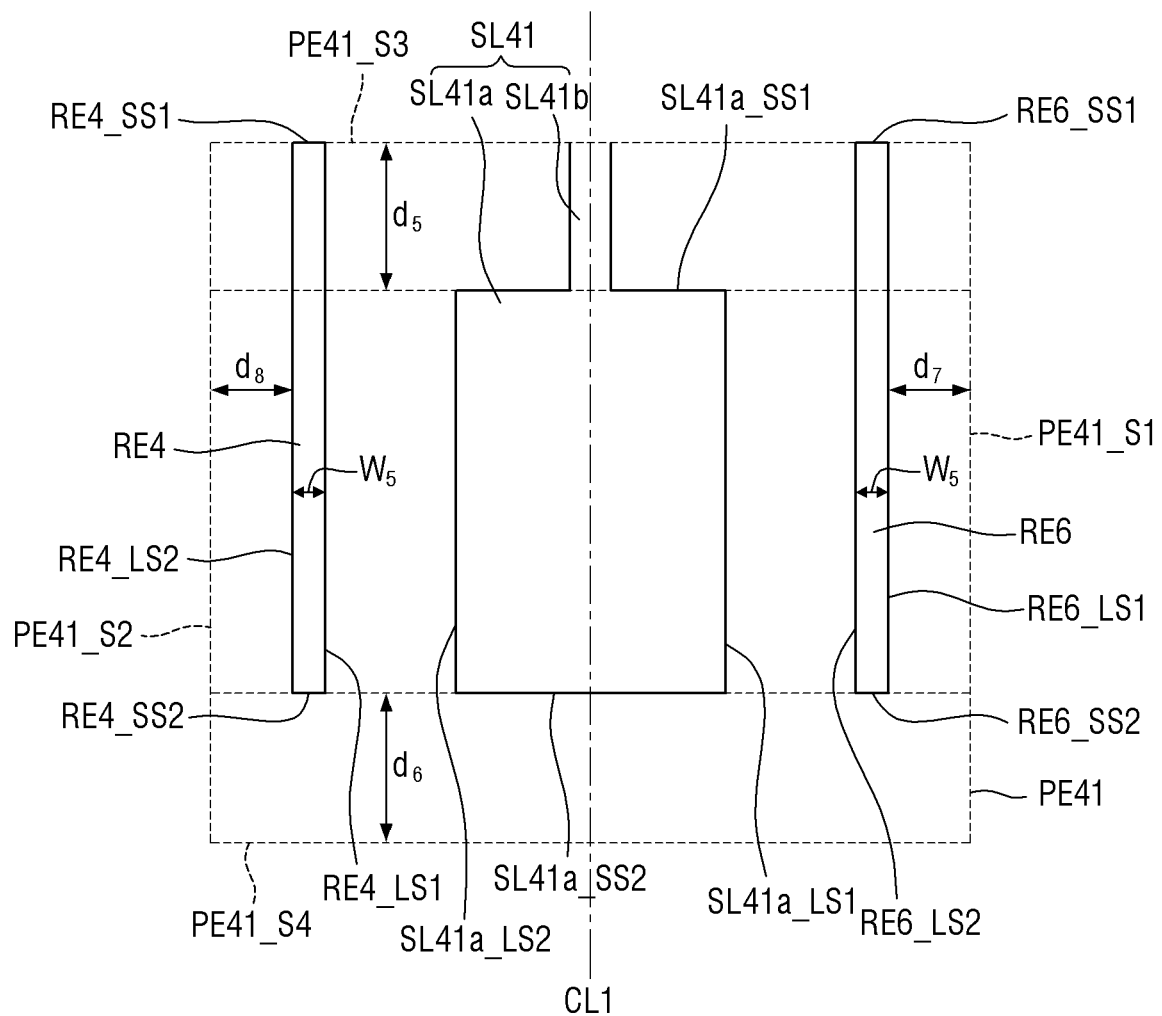
FIG. 7B is a layout view illustrating a modified example of FIG. 7A according to some example embodiments.
Figure 7C:
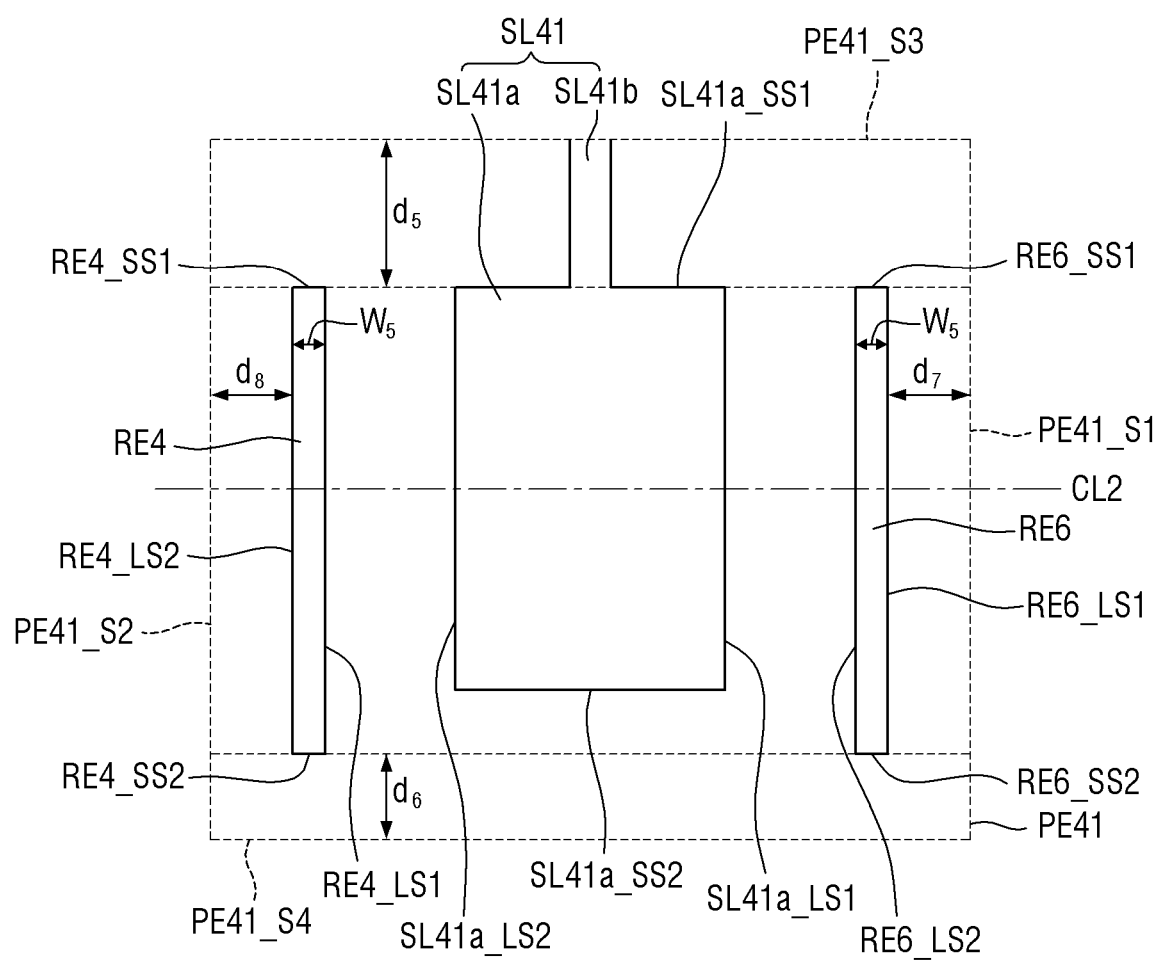
FIG. 7C is a layout view illustrating a modified example of FIG. 7A according to some example embodiments.
Figure 7D:
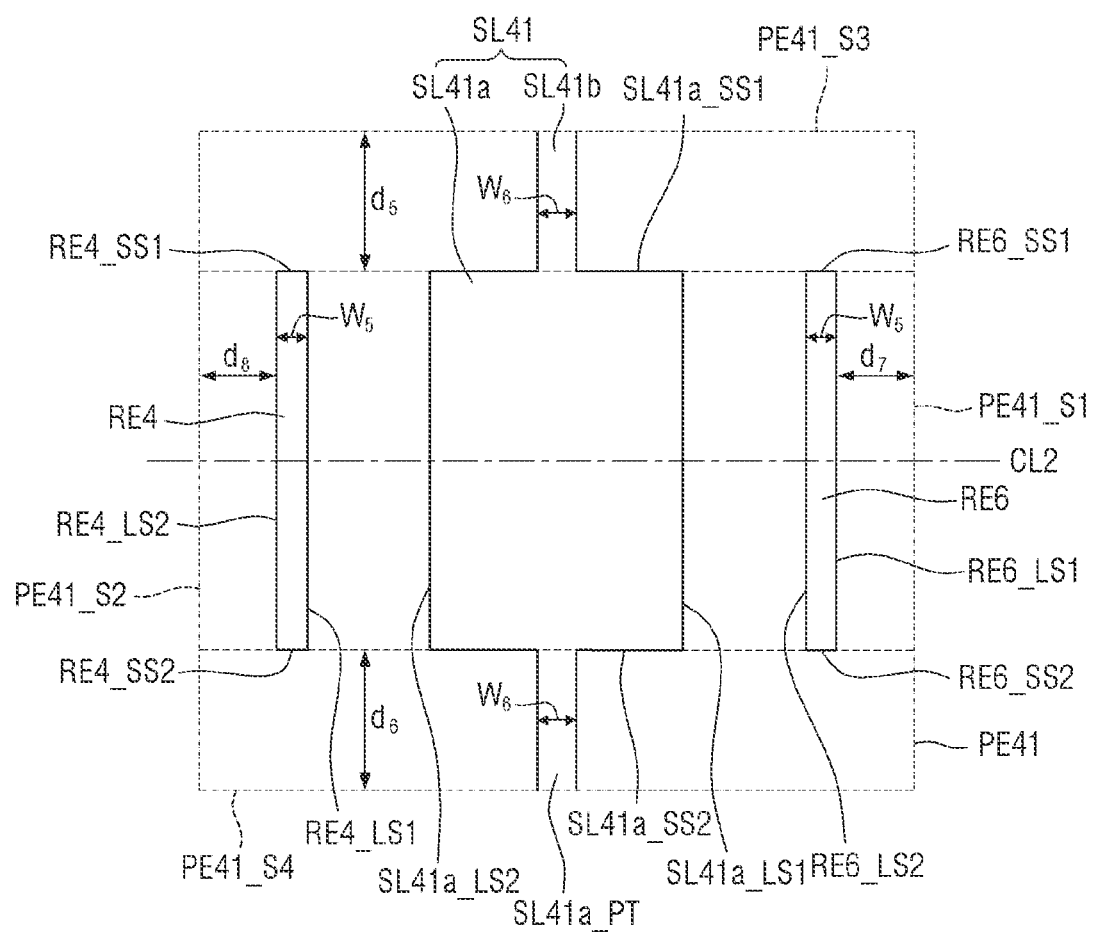
FIG. 7D is a layout view illustrating a modified example of FIG. 7A according to some example embodiments.

FIG. 7B is a layout view illustrating a modified example of FIG. 7A, FIG. 7C is a layout view illustrating a modified example of FIG. 7A, and FIG. 7D is a layout view illustrating a modified example of FIG. 7A.

Referring to FIG. 7B, the embodiments described with respect to FIG. 7A differ from the embodiments described with respect to FIG. 7A in that fourth and sixth dummy separation line parts RE4 and RE6 protrude beyond a (4,1)-th pad contact part SL41a, on a first side, in the second direction DR2, of a (4,1)-th pad electrode PE41. First dummy separation line part short sides RE4_SS1 and RE6_SS1 of the fourth and sixth dummy separation line parts RE4 and RE6 may be arranged closer than a first pad contact part short side SL41a_SS1 of the (4,1)-th pad contact part SL41a to a third pad electrode side PE41_S3. For example, the first dummy separation line part short sides RE4_SS1 and RE6_SS1 may be aligned with the third pad electrode side PE41_S3 in the third direction DR1.

Referring to FIG. 7C, the embodiments described with respect to FIG. 7C differ from the embodiments described with respect to FIG. 7A in that fourth and sixth dummy separation line parts RE4 and RE6 protrude beyond a (4,1)-th pad contact part SL41a, on a second side, in the second direction DR2, of a (4,1)-th pad electrode PE41. Second dummy separation line part short sides RE4_SS2 and RE6_SS2 of the fourth and sixth dummy separation line parts RE4 and RE6 may be arranged closer than a second pad contact part short side SL41a_SS2 of the (4,1)-th pad contact part SL41a to a fourth pad electrode side PE41_S4.

Referring to FIG. 7D, the embodiments described with respect to FIG. 7A differ from the embodiments described with respect to FIG. 7A in that a line protrusion part SL41a_PT, which protrudes from a second pad contact part short side SL41a_SS2 of a (4,1)-th pad contact part SL41a, on a second side, in the second direction DR2, of a (4,1)-th pad electrode PE41, is further provided. The line protrusion part SL41a_PT may be directly connected to a second pad contact part short side SL41a_552 of the (4,1)-th pad contact part SL41a. The width, in the first direction DR1, of the line protrusion part SL41a_PT may be the same as a width $W_5$, in the first direction DR1, of a (4,1)-th line part SL41b.

Because the line protrusion part SL21a_PT is further provided and is symmetrical with the (4,1)-th line part SL41b, fourth and sixth dummy separation line parts RE4 and RE6 and a (4,1)-th signal line SL41 can become symmetrical with respect to a second reference line CL2, and thus, bonding reliability can be further improved.

The pads PADpq, which are arranged in the rows Rm and the columns Cn, the pad contact parts SLpqa, which overlap with the pads PADpq, and first-side patterns and second-side patterns of the pad contact parts SLpqa will hereinafter be described with reference again to FIG. 4.

The (1,1)-th pad electrode PE11 may correspond to the (1,1)-th signal line SL11. The (1,1)-th pad electrode PE11 may be arranged to generally overlap with the (1,1)-th pad contact part SL11a of the (1,1)-th signal line SL11 in the thickness direction. The (1,1)-th line part SL11b may extend from the (1,1)-th pad contact part SL11a toward a first side, in the second direction DR2, of the (1,1)-th pad electrode PE11. Part of the (1,1)-th line part SL11b may overlap with the (1,1)-th pad electrode PE11 in the thickness direction. The (4,2)-th line part SL42b may be arranged on a first side, in the first direction DR1, of the (1,1)-th pad contact part SL11a, and the (2,1)-th line part SL21b may be arranged on a second side, in the first direction DR1, of the (1,1)-th pad contact part SL11a.

That is, because the first-side pattern of the (1,1)-th pad contact part SL11a is the (4,2)-th line part SL42b and the second-side pattern of the (1,1)-th pad contact part SL11a is the (2,1)-th line part SL21b, the (1,1)-th pad contact part SL11a is considered include (or consisting of) the first combination. Once it is identified which combination the first- and second-side patterns of a pad contact part SLpqa consist of, the locations of the first- and second-side patterns relative to a pad PADpq corresponding to the pad contact part SLpqa and the relationships between the lengths of the first- and second-side patterns and the length of the pad PADpq corresponding to the pad contact part SLpqa can be easily identified, as mentioned above, and thus, some detailed descriptions thereof may be omitted. The (2,1)-th line part SL21b, which is connected to the (2,1)-th pad contact part SL21a, may form the second-side pattern of the (1,1)-th pad contact part SL11a.

The (3,1)-th pad electrode PE31 may correspond to the (3,1)-th signal line SL31. The (3,1)-th pad electrode PE31 may be arranged to generally overlap with a (3,1)-th pad contact part SL31a of the (3,1)-th signal line SL31 in the thickness direction. A (3,1)-th line part SL31b may extend from the (3,1)-th pad contact part SL31a toward a first side, in the second direction DR2, of the (3,1)-th pad electrode PE31. Part of the (3,1)-th line part SL31b may overlap with the (3,1)-th pad electrode PE31 in the thickness direction.

The (4,2)-th line part SL42b may be located on a first side, in the first direction DR1, of the (3,1)-th pad contact part SL31a, and the second dummy separation line part RE2 may be located on a second side, in the first direction DR1, of the (3,1)-th pad contact part SL31a. That is, the first-side pattern of the (3,1)-th pad contact part SL31a is the (4,2)-th line part SL42b and the second-side pattern of the (3,1)-th pad contact part SL31a is the second dummy separation line part RE2, the (3,1)-th pad contact part SL31a is considered including (or consisting of) the third combination.

The (4,2)-th line part SL42b and the second dummy separation line part RE2 may be electrically isolated from each other. The second dummy separation line part RE2 may be a floating electrode isolated from neighboring signal lines SL. The second dummy separation line part RE2 may be aligned with the first dummy separation line part RE1 in the second direction DR2.

The (4,1)-th pad electrode PE41 may correspond to the (4,1)-th signal line SL41. The (4,1)-th pad electrode PE41 may be arranged to generally overlap with a (4,1)-th pad contact part SL41a of the (4,1)-th signal line SL41 in the thickness direction. The (4,1)-th line part SL41b may extend from the (4,1)-th pad contact part SL41a toward the first side, in the second direction DR2, of the (4,1)-th pad electrode PE41, may be bent in a direction toward the second side, in the first direction DR1, of the (4,1)-th pad electrode PE41, and may extend in the direction toward the first side, in the second direction DR2, of the (4,1)-th pad electrode PE41. Part of the (4,1)-th line part SL41b may overlap with the (4,1)-th pad electrode PE41 in the thickness direction.

The sixth dummy separation line part RE6 may be arranged on the first side, in the first direction DR1, of the (4,1)-th pad contact part SL41, and the fourth dummy separation line part RE4 may be arranged on the second side, in the first direction DR1, of the (4,1)-th pad contact part SL41. That is, because the first-side pattern of the (4,1)-th pad contact part SL41a is the sixth dummy separation line part RE6 and the second-side pattern of the (4,1)-th pad contact part SL41a is the fourth dummy separation line part RE4, the (4,1)-th pad contact part SL41a is considered including (or consisting of) the second combination The fourth and sixth dummy separation line parts RE4 and RE6 may be electrically isolated from each other. The fourth and sixth dummy separation line parts RE4 and RE6 may be floating electrodes that are separate from neighboring signal lines SL. The fourth dummy separation line part RE4 may be aligned with the second dummy separation line part RE2 in the second direction DR2, and the sixth dummy separation line part RE6 may be aligned with the (4,2)-th line part SL42b in the second direction DR2.

The arrangements, in the first column C1, of the pad electrodes PEpq, the signal lines SLpq, and the dummy separation line parts RE may directly apply to other columns Cn (e.g., the second, third, and fourth columns C2, C3, and C4), and thus, some detailed descriptions thereof may be omitted.

The (3,2)-th pad electrode PE32 may correspond to the (3,2)-th signal line SL32. The (3,2)-th pad electrode PE32 may be arranged to generally overlap with a (3,2)-th pad contact part SL32a of the (3,2)-th signal line SL32 in the thickness direction. A (3,2)-th line part SL32b may extend from the (3,2)-th pad contact part SL32a toward a first side, in the second direction DR2, of the (3,2)-th pad electrode PE32, may be bent in a direction toward a second side, in the first direction DR1, of the (3,2)-th pad electrode PE32, and may extend in the direction toward the first side, in the second direction DR2, of the (3,2)-th pad electrode PE32. Part of the (3,2)-th line part SL32b may overlap with the (3,2)-th pad electrode PE32 in the thickness direction.

A (4,2)-th pad electrode PE42 may correspond to the (4,2)-th signal line SL42. The (4,2)-th pad electrode PE42 may be arranged to generally overlap with a (4,2)-th pad contact part SL42a of the (4,2)-th signal line SL42 in the thickness direction. A (4,2)-th line part SL42b may extend from the (4,2)-th pad contact part SL42a toward a first side, in the second direction DR2, of the (4,2)-th pad electrode PE42, may be bent in a direction toward a second side, in the first direction DR1, of the (4,2)-th pad electrode PE42, and may extend in the direction toward the first side, in the second direction DR2, of the (4,2)-th pad electrode PE42. Part of the (4,2)-th line part SL42b may overlap with the (4,2)-th pad electrode PE42 in the thickness direction.

The (4,2)-th line part SL42b, which is bent in the direction toward the second side, in the first direction DR1, of the (4,2)-th pad electrode PE42 and extends in the direction toward the first side, in the second direction DR2, of the (4,2)-th pad electrode PE42, may form the first-side patterns of the (3,1)-, (2,1)-, and (1,1)-th pad contact parts SL31a, SL21a, and SL11a, which are arranged in the third, second, and first rows R3, R2, and R1, respectively, and in the first column C1.

Figure 8:
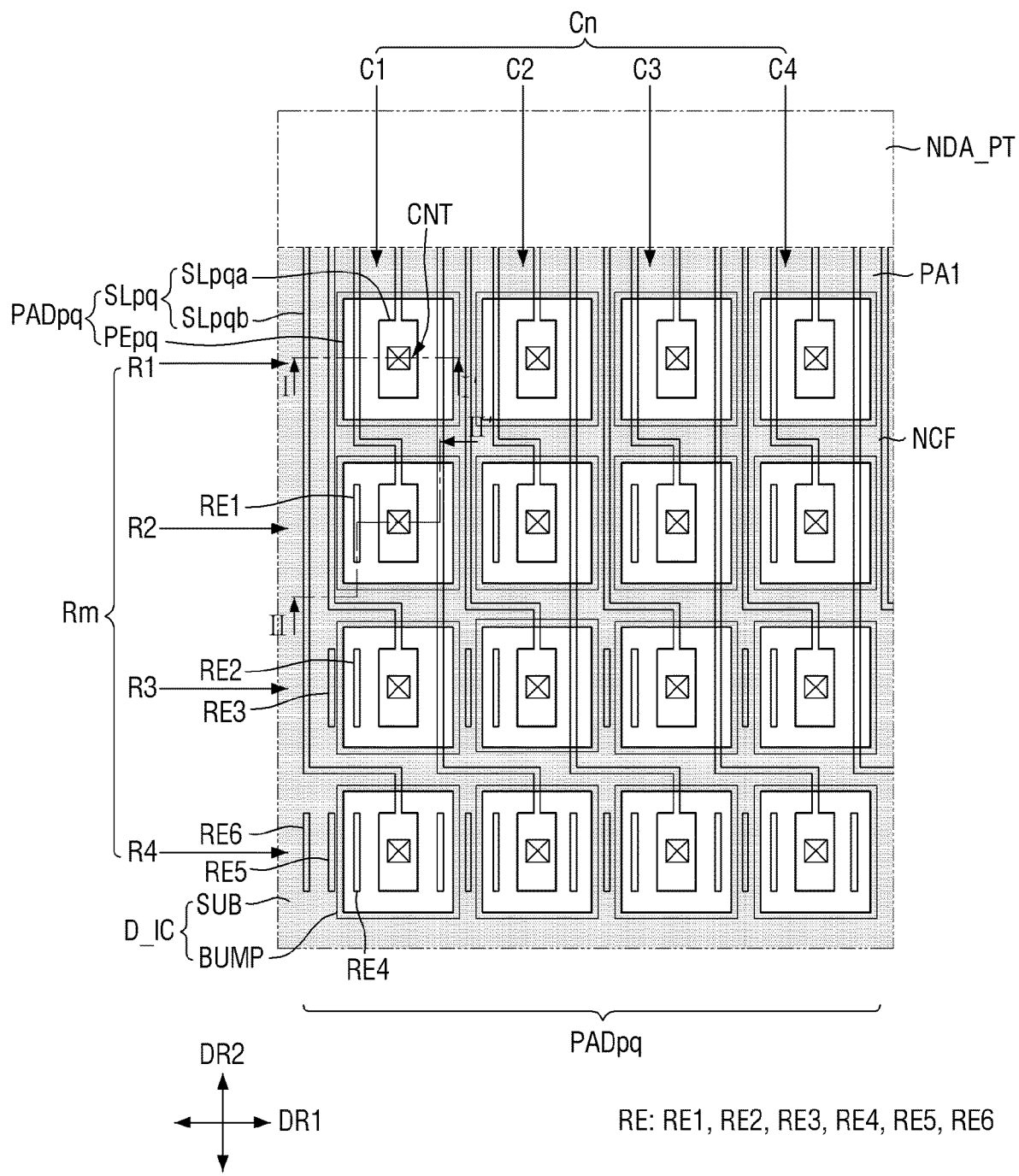
FIG. 8 is a layout view illustrating a first pad area according to some example embodiments of the present disclosure.
Figure 9:
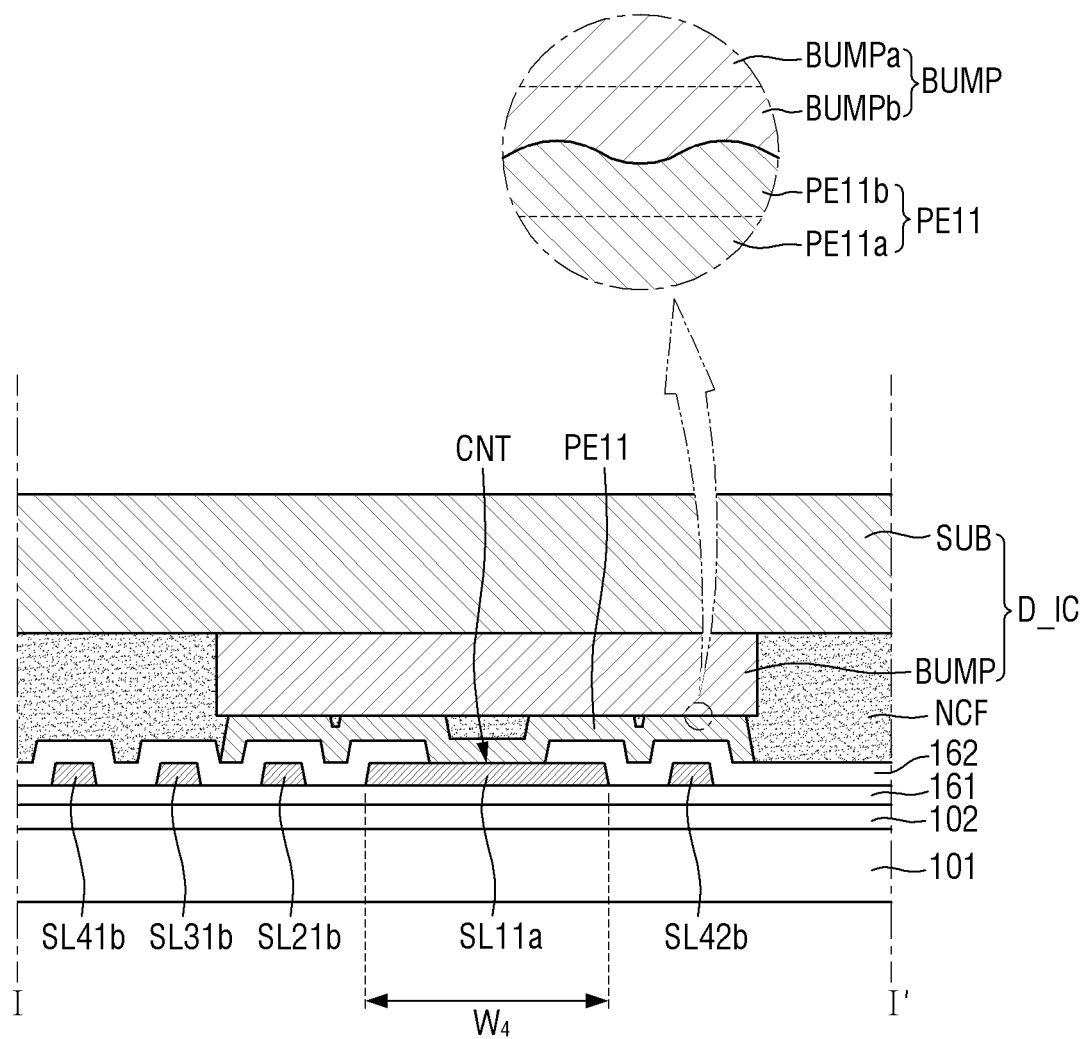
FIG. 9 is a cross-sectional view taken along the line I-I' of FIG. 8.
Figure 10:
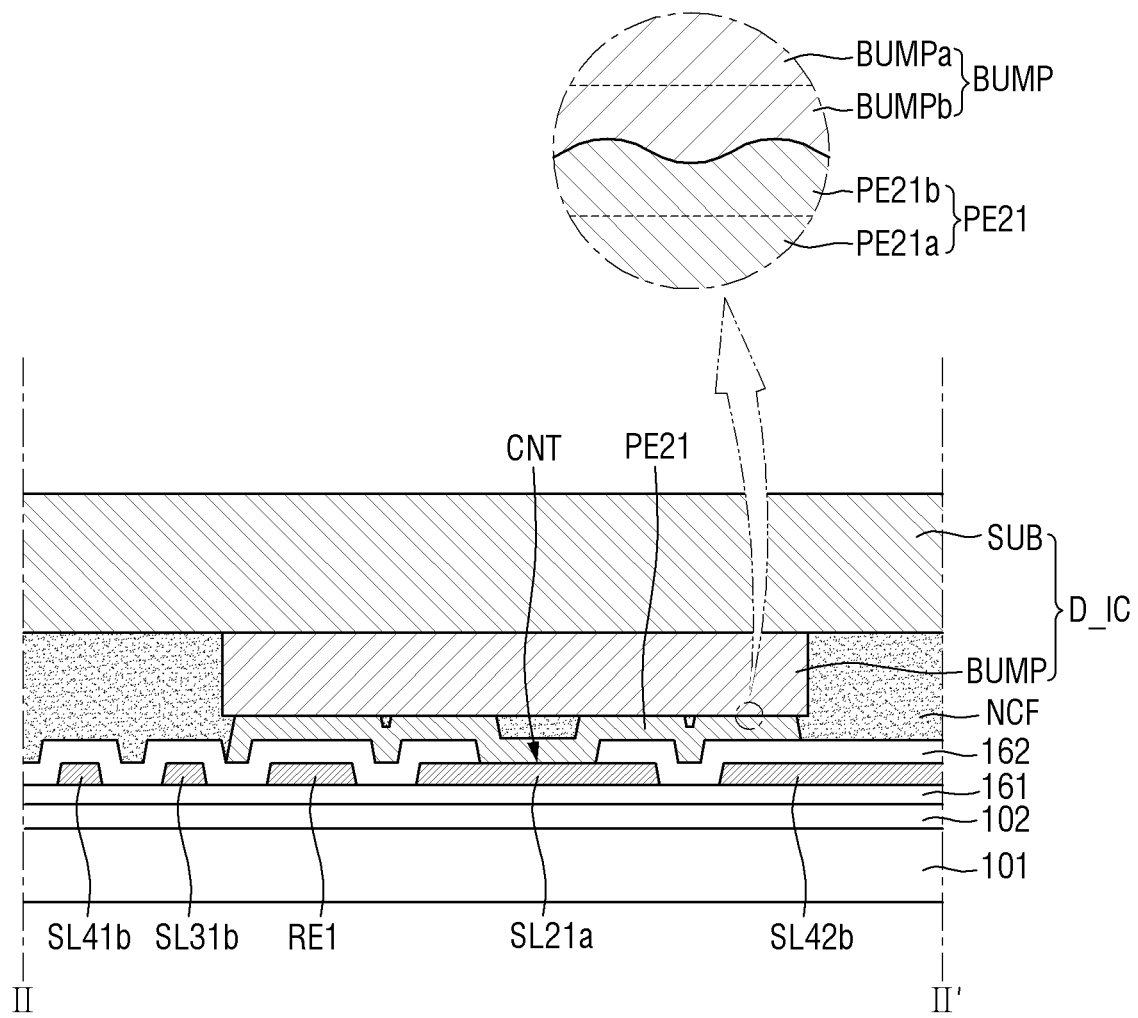
FIG. 10 is a cross-sectional view taken along the line II-II' of FIG. 8.

FIG. 8 is a layout view illustrating a first pad area according to some example embodiments of the present disclosure, FIG. 9 is a cross-sectional view taken along the line I-I' of FIG. 8, and FIG. 10 is a cross-sectional view taken along the line II-II' of FIG. 8. The pads PADpq will hereinafter be described, taking the (1,1)- and (2,1)-th pads PAD11 and PAD21, and the pad contact parts SLpqa, the line parts SLpqb, and the dummy separation lines RE corresponding to the (1,1)- and (2,1)-th pads PAD11 and PAD21 will also hereinafter be described. The descriptions of the (1,1)- and (2,1)-th pads PAD11 and PAD21 and of the pad contact parts SLpqa, the line parts SLpqb, and the dummy separation lines RE corresponding to the (1,1)- and (2,1)-th pads PAD11 and PAD21 may directly apply to other pads PADpq, other pad contact parts SLpqa, other line parts SLpqb, and other dummy separation lines RE.

Referring to FIGS. 8 through 10, the driving member D_IC may be located in the first pad area PA1. Bumps BUMP of the driving member D_IC may be located on the pads PADpq. The pads PADpq and the bumps BUMP that overlap with the pads PADpq may be directly coupled together. The display device 1 may include a display panel and the driving member D_IC, which is located on the display panel.

The display panel may include a base substrate 101 and a plurality of conductive layers, a plurality of insulating layers, and an organic light-emitting layer, which are located on the base substrate 101. The display panel may further include a buffer layer 102, which is located on the base substrate 101, a first insulating layer 161, which is located on the buffer layer 102, pad contact parts SLpqa, line parts SLpqb, and dummy separation line parts RE, which are located on the first insulating layer 161, a second insulating layer 162, which is located on the pad contact parts SLpqa, the line parts SLpqb, and the dummy separation line parts RE, and pads PADpq, which are located on the second insulating layer 162.

As illustrated in FIG. 8, the (1,1)-th pad contact part SL11a, the (4,1)-th line part SL41b, the (3,1)-th line part SL31b, the (2,1)-th line part SL21b, and the (4,2)-th line part SL42b may be arranged at equal intervals. The second insulating layer 162 may be located on the (1,1)-th pad contact part SL11a, the (4,1)-th line part SL41b, the (3,1)-th line part SL31b, the (2,1)-th line part SL21b, and the (4,2)-th line part SL42b and may include a contact hole CNT that exposes part of the top surface of the (1,1)-th pad contact part SL11a. As illustrated in FIG. 9, the second insulating layer 162 may be located on the (2,1)-th pad contact part SL21a, the (4,1)-th line part SL41b, the (3,1)-th line part SL31b, the first dummy separation line part RE1, and the (4,2)-th line part SL42b. The second insulating layer 162 may further include a contact hole CNT that exposes part of the top surface of the (2,1)-th pad contact part SL21a.

The (1,1)-th pad contact part SL11a, the (4,1)-th line part SL41b, the (3,1)-th line part SL31b, the (2,1)-th line part SL21b, and the (4,2)-th line part SL42b may be electrically isolated from one another. The first dummy separation line part RE1 and the (4,2)-th line part SL42b may be electrically isolated from each other.

As illustrated in FIG. 9, the second insulating layer 162 may conformally reflect surface height differences formed by the (1,1)-th pad contact part SL11a, the (4,1)-th line part SL41b, the (3,1)-th line part SL31b, the (2,1)-th line part SL21b, and the (4,2)-th line part SL42b. Parts of the second insulating layer 162 that overlap with the (1,1)-th pad contact part SL11a, the (4,1)-th line part SL41b, the (3,1)-th line part SL31b, the (2,1)-th line part SL21b, and the (4,2)-th line part SL42b in the thickness direction may include protrusions on the surfaces thereof, and parts of the second insulating layer 162 that do not overlap with the (1,1)-th pad contact part SL11a, the (4,1)-th line part SL41b, the (3,1)-th line part SL31b, the (2,1)-th line part SL21b, and the (4,2)-th line part SL42b may include recesses on the surfaces thereof.

As illustrated in FIG. 10, the second insulating layer 162 may conformally reflect surface height differences formed by the (2,1)-th pad contact part SL21a, the (4,1)-th line part SL41*b*, the (3,1)-th line part SL31*b*, the first dummy separation line part RE1, and the (4,2)-th line part SL42*b*. Parts of the second insulating layer 162 that overlap with the (2,1)-th pad contact part SL21*a*, the (4,1)-th line part SL41*b*, the (3,1)-th line part SL31*b*, the first dummy separation line part RE1, and the (4,2)-th line part SL42*b* in the thickness direction may include protrusions on the surfaces thereof, and parts of the second insulating layer 162 that do not overlap with the (2,1)-th pad contact part SL21*a*, the (4,1)-th line part SL41*b*, the (3,1)-th line part SL31*b*, the first dummy separation line part RE1, and the (4,2)-th line part SL42*b* may include recesses on the surfaces thereof.

The (1,1)-th pad electrode PE11 may be located on the second insulating layer 162 to overlap with the (2,1)-th line part SL21*b*, the (4,2)-th line part SL42*b*, and the (1,1)-th pad contact part SL11*a* in the thickness direction. The (1,1)-th pad electrode PE11 may completely cover the (2,1)-th line part SL21*b*, the (4,2)-th line part SL42*b*, and the (1,1)-th pad contact part SL11*a*.

The (2,1)-th pad electrode PE21 may be located on the second insulating layer 162 to overlap with the first dummy separation line part RE1, the (4,2)-th line part SL42*b*, and the (2,1)-th pad contact part SL21*a* in the thickness direction. The (2,1)-th pad electrode PE21 may completely cover the first dummy separation line part RE1, the (4,2)-th line part SL42*b*, and the (2,1)-th pad contact part SL21*a*.

The (1,1)-th pad electrode PE11 may be in direct contact with, and electrically connected to, the (1,1)-th pad contact part SL11*a* through a contact hole CNT of the second insulating layer 162.

The (1,1)-th pad electrode PE11 may conformally reflect height differences on the surface of the second insulating layer 162. Thus, parts of the (1,1)-th pad electrode PE11 that overlap with the protrusions on the surface of the second insulating layer 162 in the thickness direction may include protrusions on the surfaces thereof, and parts of the (1,1)-th pad electrode PE11 that overlap with the recesses on the surface of the second insulating layer 162 in the thickness direction may include recesses on the surfaces thereof.

A bump BUMP may be located on the (1,1)-th pad electrode PE11 including protrusions and recesses on the surface thereof. The (1,1)-th pad electrode PE11 and the bump BUMP that overlap with each other may be electrically connected. The (1,1)-th pad electrode PE11 and the bump BUMP may be coupled so that they can be in direct contact with each other. The (1,1)-th pad electrode PE11 and the bump BUMP may be coupled via ultrasonic bonding.

The connection between the (2,1)-th pad electrode PE21 and the (2,1)-th pad contact part SL21*a* and the surface shape of the (2,1)-th pad electrode PE21 are substantially the same as the connection between the (1,1)-th pad electrode PE11 and the (1,1)-th pad contact part SL11*a* and the surface shape of the (1,1)-th pad electrode PE11, and thus, some detailed descriptions thereof may be omitted.

The (2,1)-th pad electrode PE21, like the (1,1)-th pad electrode PE11, may be coupled to a bump BUMP via ultrasonic bonding, and thus, some detailed description of how to couple the (2,1)-th pad electrode PE21 and a bump BUMP via ultrasonic bonding may be omitted.

An ultrasonic bonding process will hereinafter be described with reference to FIGS. 11 and 12.

Figure 11:
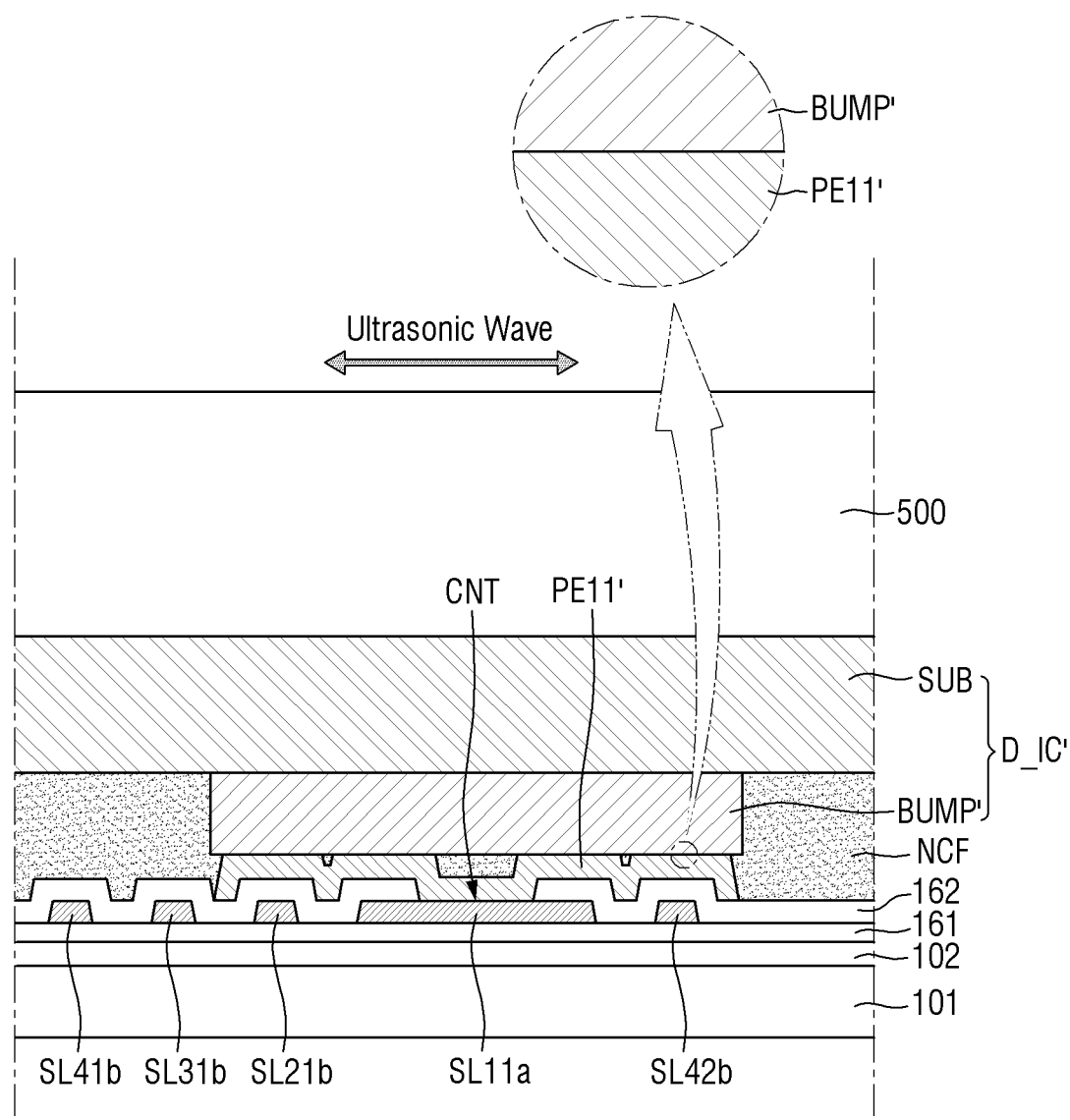
FIG. 11 is a cross-sectional view illustrating how to perform ultrasonic bonding between a display panel and a driving member with the use of an ultrasonic bonding apparatus, according to some example embodiments of the present disclosure.
Figure 12:
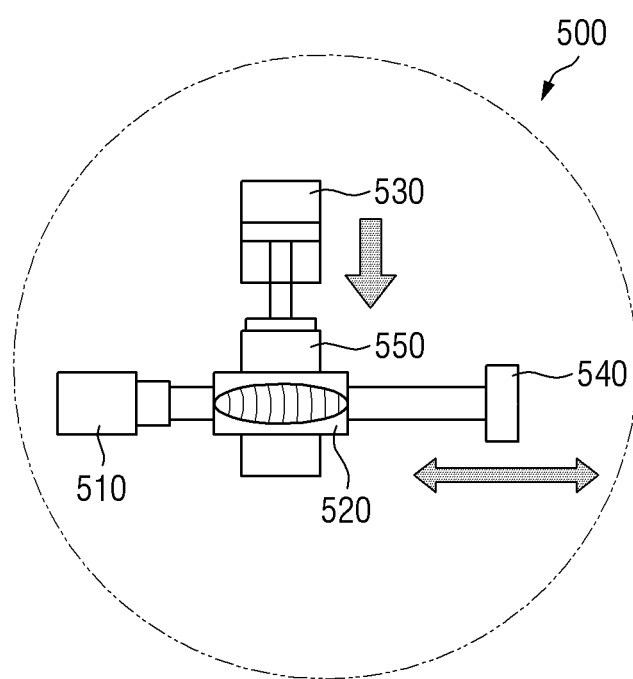
FIG. 12 illustrates the ultrasonic bonding apparatus of FIG. 11 according to some example embodiments.

FIG. 11 is a cross-sectional view illustrating how to perform ultrasonic bonding between a display panel and a driving member with the use of an ultrasonic bonding apparatus, according to some example embodiments of the present disclosure, and FIG. 12 illustrates the ultrasonic bonding apparatus of FIG. 11.

Referring to FIGS. 11 and 12, a bump BUMP' of a driving member D_IC' may be placed over a pad electrode PE11', and ultrasonic bonding may be performed using an ultrasonic bonding apparatus 500. The ultrasonic bonding apparatus 500 may include a vibration generating unit 510, a vibration unit 520, which is connected to the vibration generating unit 510, a pressing unit 530, which amplifies the vibration amplitude of the vibration unit 520, a vibration transmitting unit 540, which is connected to the vibration unit 520, and a support unit 550. The vibration generation unit 510 may convert electrical energy into vibration energy. The vibration unit 520 may vibrate with the vibration energy generated by the vibration generation unit 510. The vibration unit 520 may vibrate with a vibration direction (e.g., a set or predetermined vibration direction) and with an amplitude (e.g., a set or predetermined amplitude). The amplitude of the vibration unit 520 may be amplified in a direction parallel to the vibration direction of the vibration unit 520 via the pressing unit 530, which is connected to the vibration unit 520. The vibration transmitting unit 540 may transmit the vibration of the vibration unit 520 to the driving member D_IC'. The support part 550 may fix the top and bottom surfaces of the vibration unit 520 to prevent or reduce instances of the vibration unit 520 and the vibration transmitting unit 540 vertically flowing due to the vibration of the vibration unit 520.

If the bump BUMP' of the driving member D_IC' is placed over the (1,1)-th pad electrode PE11' and an ultrasonic process "Ultrasonic Wave" is performed under pressure with the use of the ultrasonic bonding apparatus 500, a frictional force may be generated at the interface between the bump BUMP' and the (1,1)-th pad electrode PE11' so that the ingredients of the bump BUMP' and the ingredients of the (1,1)-th pad electrode PE11' may diffuse to each other.

It will hereinafter be described how to perform ultrasonic bonding between the bump BUMP' of the driving member D_IC' and the (1,1)-th pad electrode PE11' with reference to FIGS. 9 and 11. Referring to FIGS. 9 and 11, the ingredients of the bump BUMP of the driving member D_IC may diffuse in part into the (1,1)-th pad electrode PE11, and the ingredients of the (1,1)-th pad electrode PE11 may diffuse in part into the bump BUMP of the driving member D_IC. As a result, as illustrated in FIG. 9, the (1,1)-th pad electrode PE11 may include a region PE11*a* where the ingredients of the bump BUMP of the driving member D_IC diffuse and a region PE11*a* where only the ingredients of the (1,1)-th pad electrode PE11 are present, and the bump BUMP of the driving member D_IC may include a region BUMPb where the ingredients of the (1,1)-th pad electrode PE11 diffuse and a region BUMPa where only the ingredients of the bump BUMP are present.

The bump BUMP' and the (1,1)-th pad electrode PE11' may be placed in contact with, and directly coupled to, each other in the regions PE11*b* and BUMPb. The interface between the bump BUMP' and the (1,1)-th pad electrode PE11' may become non-flat after undergoing melting and solidification. Also, as the ingredients of the bump BUMP' and the ingredients of the (1,1)-th pad electrode PE11' diffuse, alloys of different heterogenous materials may be formed at the interface between the bump BUMP' and the (1,1)-th pad electrode PE11'.

Similarly, referring to FIG. 10, as a bump BUMP of the driving member D_IC and the (2,1)-th pad electrode PE21 are directly coupled, the (2,1)-th pad electrode PE21, like the (1,1)-th pad electrode PE11, may include a region PE21*a* where the ingredients of the bump BUMP diffuse and a region PE21*a* where only the ingredients of the (1,1)-th pad electrode PE11 are present, and the bump BUMP may include a region BUMPb where the ingredients of the (2,1)-th pad electrode PE21 diffuse and a region BUMPa where only the ingredients of the bump BUMP are present.

Referring again to FIG. 11, the (1,1)-th pad electrode PE11' may include protrusions on the surface thereof in areas that overlap with the (2,1)-th line part SL21b, the (4,2)-th line part SL42b, and the (1,1)-th pad contact part SL11a in the thickness direction, and because the (2,1)-th line part SL21b, the (4,2)-th line part SL42b, and the (1,1)-th pad contact part SL11a are arranged at equal intervals, protrusions may be formed on the surface of the (1,1)-th pad electrode PE11' at equal intervals. The description of the protrusions on the surface of the (1,1)-th pad electrode PE11' may directly apply to other pad electrodes (see PEpq of FIG. 8). That is, because protrusions can be arranged in the same manner on the surface of each of the pad electrodes PEpq and the bonding area between the pad electrodes PEpq and the bumps BUMP can be substantially uniformly maintained, the bonding reliability between the pad electrodes PEpq and the driving member D_IC' can be secured in a first pad area (see PA1 of FIG. 7).

The non-conductive coupling member NCF is placed on the (1,1)-th pad electrode PE11' before ultrasonic bonding and flows in the space between the bump BUMP' and the (1,1)-th pad electrode PE11' and via the side surfaces of the bump BUMP' and the side surfaces of the (1,1)-th pad electrode PE11'.

As illustrated in FIGS. 9 and 10, the non-conductive coupling member NCF may be in direct contact with the side surfaces of each of the bumps BUMP and with the side surfaces of each of the (1,1)- and (2,1)-th pad electrodes PE11 and PE21. The non-conductive coupling member NCF may be located in the spaces between the bumps BUMP and the (1,1)- and (2,1)-th pad electrodes PE11 and PE21. The non-conductive coupling member NCF may be in direct contact with the (1,1)- and (2,1)-th pad electrodes PE11 and PE21, in the spaces between the bumps BUMP and the (1,1)- and (2,1)-th pad electrodes PE11 and PE21.

Figure 13:
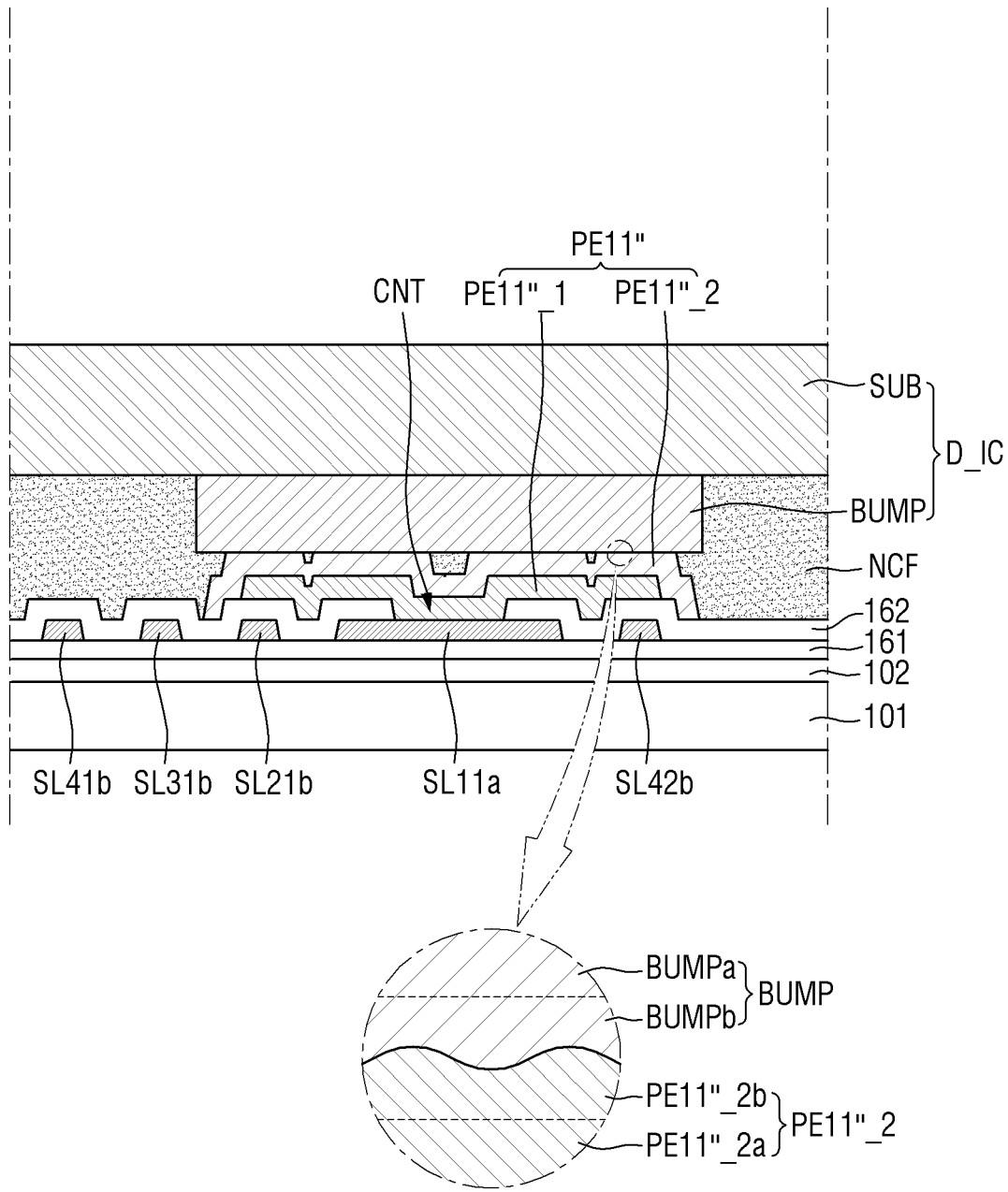
FIG. 13 is a cross-sectional view illustrating a modified example of FIG. 9 according to some example embodiments.

FIG. 13 is a cross-sectional view illustrating a modified example of FIG. 9.

Referring to FIG. 13, a (1,1)-th pad electrode PE11" may include (1,1)-th pad electrode parts PE11"_1 and PE11"_2. The (1,1)-th pad electrode part PE11"_2 may be located on the (1,1)-th pad electrode part PE11"_1. Both end portions of the (1,1)-th pad electrode part PE11"_2 may extend outwardly beyond both end portions of the (1,1)-th pad electrode part PE11"_1, and the (1,1)-th pad electrode part PE11"_2 may completely cover the (1,1)-th pad electrode part PE11"_1.

The (1,1)-th pad electrode part PE11"_2 may be in direct contact with, and electrically connected to, the (1,1)-th pad electrode part PE11"_1.

The (1,1)-th pad electrode part PE11"_2 may be electrically connected to a bump BUMP and may be directly coupled to the bump BUMP via ultrasonic bonding.

As illustrated in FIG. 13, as the bump BUMP and the (1,1)-th pad electrode part PE11"_2 are directly coupled, the (1,1)-th pad electrode part PE11"_2 may include a region where the ingredients of the bump BUMP diffuse and a region where only the ingredients of the (1,1)-th pad electrode part PE11"_2 are present, and the bump BUMP may include a region BUMPb where the ingredients of the (1,1)-th pad electrode part PE11"_2 diffuse and a region BUMPa where only the ingredients of the bump BUMP are present.

Elements illustrated in FIG. 13, but not explained herein, are almost the same as their respective counterparts of FIG. 9, and thus, some detailed descriptions thereof may be omitted.

Figure 14:
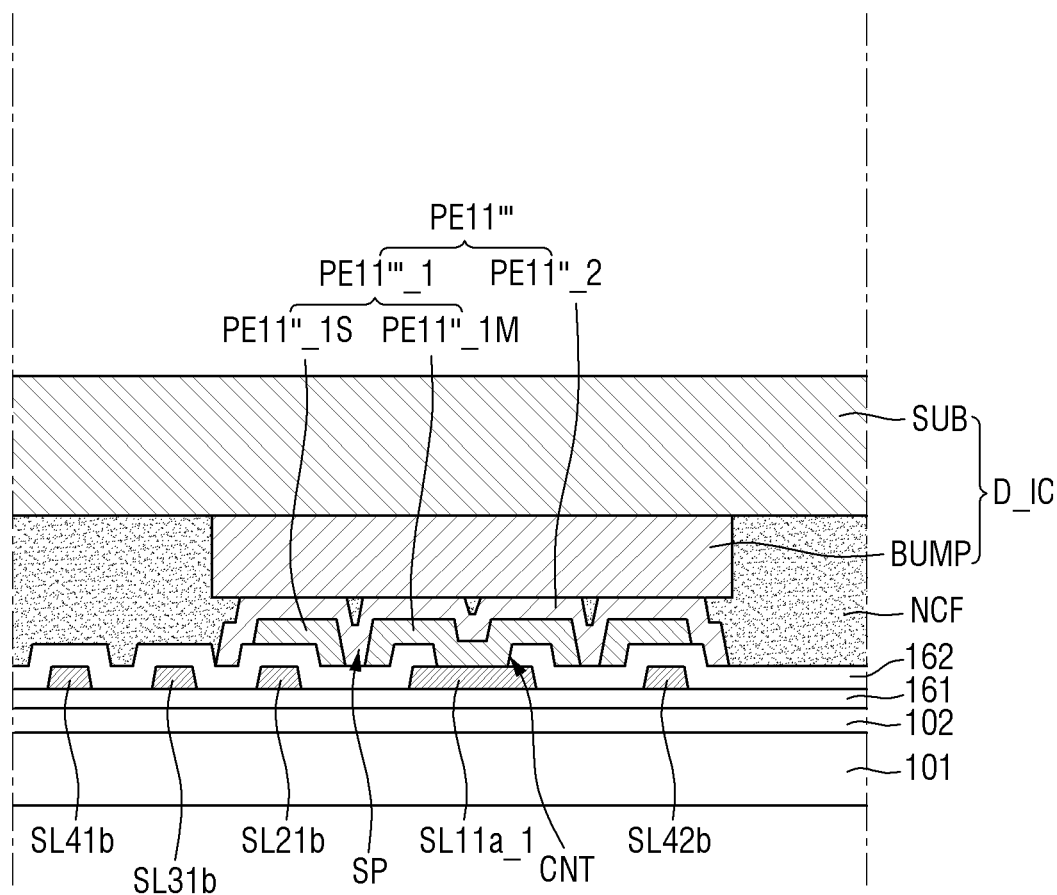
FIG. 14 is a cross-sectional view illustrating a modified example of FIG. 13 according to some example embodiments.

FIG. 14 is a cross-sectional view illustrating a modified example of FIG. 13.

Referring to FIG. 14, a (1,1)-th pad electrode PE11''' differs from the (1,1)-th pad electrode PE11" of FIG. 13 in that it includes a (1,1)-th pad electrode part PE11'''_1.

According to some example embodiments, the (1,1)-th pad electrode part PE11'''_1 may include a plurality of pad pattern parts that are not integrally formed, but are separate from one another. As illustrated in FIG. 14, the (1,1)-th pad electrode part PE11'''_1 may include a main pad pattern PE11"_1M, which overlaps with a (1,1)-th pad contact part SL11a_1, and sub-pad patterns PE11"_1S, which are spaced apart from the main pad pattern PE11"_1M. The sub-pad patterns PE11"_1S may overlap with (2,1)- and (4,2)-th line parts SL21b and SL42b.

A (1,1)-th pad electrode part PE11"_2 may be arranged to be in direct contact with a second insulating layer 162, in a space SP between the main pad pattern PE11"_1M and the sub-pad patterns PE11"_1S. The distance between a bump BUMP and the (1,1)-th pad electrode part PE11"_2 can be properly secured in the space SP, and as a result, the flow of a non-conductive coupling member NCF can be further facilitated.

The cross-sectional structure of the display device 1 will hereinafter be described in more detail with reference to FIG. 15.

Figure 15:
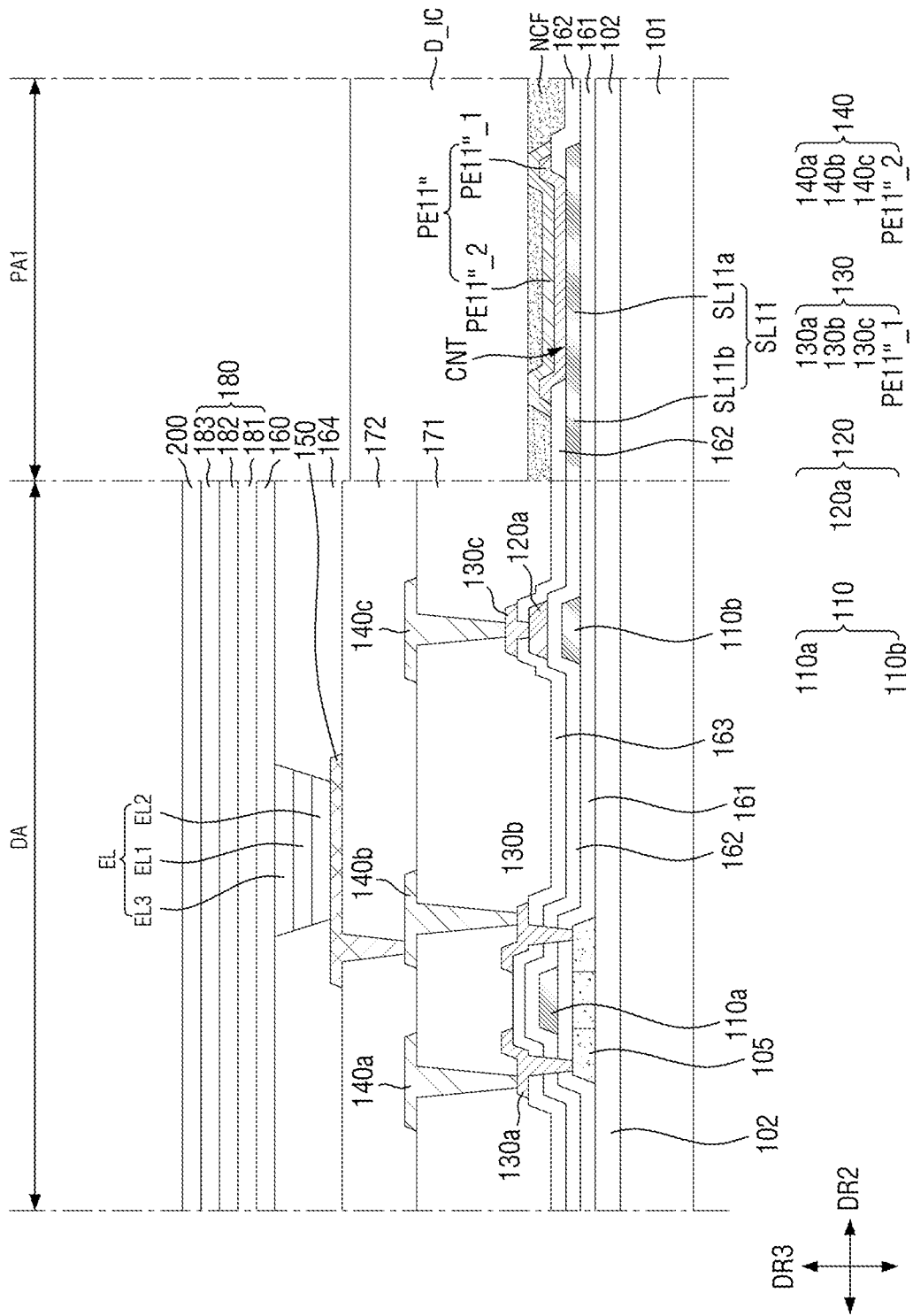
FIG. 15 is a cross-sectional view illustrating a display area and a first pad area of a display device of FIG. 1 according to some example embodiments.

FIG. 15 is a cross-sectional view illustrating the display area and the first pad area of a display device of FIG. 1. FIG. 15 illustrates a case where the (1,1)-th pad electrode PE11" of FIG. 13 is located in the first pad area PA1.

Referring to FIGS. 2 and 15, the base substrate 101 may support the layers located thereon. The base substrate 101 may be located in and across the display area DA and the non-display area NDA. For example, the base substrate 101 may be formed of an insulating material such as a polymer resin, but embodiments according to the present disclosure are not limited thereto.

The buffer layer 102 may be located on the base substrate 101. The buffer layer 102 may be located in and across the display area DA and the non-display area NDA. The buffer layer 102 may prevent or reduce the diffusion of impurity ions and the penetration of moisture or external air and may perform a surface planarization function. The buffer layer 102 may include silicon nitride, silicon oxide, or silicon oxynitride. The buffer layer 102 may be formed as a single- or multilayer film.

A semiconductor layer 105 may be located on the buffer layer 102. The semiconductor layer 105 may form the channel of a thin-film transistor (TFT). The semiconductor layer 105 may be located in each pixel PX and may be located even in the non-display area NDA, as necessary. The semiconductor layer 105 is illustrated as not being located in the first pad area PA1, which is included in the non-display area NDA, but may be located even in the first pad area PA1, as necessary.

The first insulating layer 161 may be located on the semiconductor layer 105. The first insulating layer 161 may be located on the entire surface of the base substrate 101, in and across the display area DA and the non-display area NDA. The first insulating layer 161 may be a gate insulating film having a gate insulating function. The first insulating layer 161 may include an inorganic insulating material.

A first gate conductive layer 110 may be located on the first insulating layer 161. For example, the first gate conductive layer 110 may include a gate electrode 110a of the TFT, a first electrode 110b of a storage capacitor Cst, and the (1,1)-th signal line SL11. The first gate conductive layer 110 may further include a scan signal line, which transmits a scan signal to the gate electrode 110a.

The gate electrode 110a of the TFT, the first electrode 110b of the storage capacitor Cst, and the (1,1)-th signal line SL11 may be formed of the same material by the same process. For example, the first gate conductive layer 110 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

The second insulating layer 162 may be located on the first gate conductive layer 110. The second insulating layer 162 may include a contact hole CNT. The contact hole CNT may expose the top surface of the (1,1)-th pad contact part SL11a. The second insulating layer 162 may insulate the first gate conductive layer 110 and a second gate conductive layer 120. The second insulating layer 162 may include an inorganic insulating material.

The second gate conductive layer 120 may be located on the second insulating layer 162. The second gate conductive layer 120 may include a second electrode 120a of the storage capacitor Cst. The second electrode 120a may overlap with the first electrode 110b with the second insulating layer 162 interposed therebetween. That is, the first and second electrodes 110b and 120a may form the storage capacitor Cst, which has the second insulating layer 162 as its dielectric film.

The second gate conductive layer 120 may include at least one metal selected from among Mo, Al, Pt, Pd, Ag, Mg, Au, Ni, Nd, Ir, Cr, Ca, Ti, Ta, W, and/or Cu.

A third insulating layer 163 is located on the second gate conductive layer 120. The third insulating layer 163 may insulate the second gate conductive layer 120 and a first source/drain conductive layer 130. The third insulating layer 163 may include an inorganic insulating material.

The first source/drain conductive layer 130 may be located on the third insulating layer 163. For example, the first source/drain conductive layer 130 may include a source electrode 130a and a drain electrode 130b of the TFT, a power supply voltage electrode 130c, and a (1,1)-th pad part PAD11"_1. The source electrode 130a and the drain electrode 130b may be electrically connected to a source region and a drain region, respectively, of the semiconductor layer 105 through contact holes that penetrate the third insulating layer 163, the second insulating layer 162, and the first insulating layer 161.

The (1,1)-th pad part PAD11"_1 may be located in the first pad area PA1. The (1,1)-th pad part PAD11"_1 may overlap with the (1,1)-th pad contact part SL11a and may be electrically connected to the (1,1)-th pad contact part SL11a through the contact hole CNT.

Layers including a first via layer 171 may be stacked on the first source/drain conductive layer 130, and the layers located on the first source/drain conductive layer 130 may expose the (1,1)-th pad part PAD11"_1 because they are not located in the first pad area PA1 of the non-display area NDA.

The first source/drain conductive layer 130 may include at least one metal selected from among Al, Pt, Pd, Ag, Mg, Au, Ni, Nd, Ir, Cr, Ca, Ti, Ta, W, Cu, and/or Mo.

The first via layer 171 may be located on the first source/drain conductive layer 130. The first via layer 171 may include an organic insulating material.

A second source/drain conductive layer 140 may be located on the first via layer 171. The second source/drain conductive layer 140 may include a data signal line 140a, a connecting electrode 140b, a power supply voltage line 140c, and a (1,1)-th pad part PAD11"_2. The data signal line 140a may be electrically connected to the source electrode 130a of the TFT via a contact hole that penetrates the first via layer 171. The connecting electrode 140b may be electrically connected to the drain electrode 130b of the TFT via a contact hole that penetrates the first via layer 171. The power supply voltage line 140c may be electrically connected to the power supply voltage electrode 130c via a contact hole that penetrates the first via layer 171. The (1,1)-th pad part PAD11"_2 may be electrically connected to the (1,1)-th pad part PAD11"_1.

The second source/drain conductive layer 140 may include at least one metal selected from among Al, Pt, Pd, Ag, Mg, Au, Ni, Nd, Ir, Cr, Ca, Ti, Ta, W, Cu, and/or Mo.

A second via layer 172 is located on the second source/drain conductive layer 140. The second via layer 172 may include an organic insulating material.

An anode electrode 150 is located on the second via layer 172. The anode electrode 150 may be connected to the connecting electrode 140b via a contact hole that penetrates the second via layer 172 and may thus be electrically connected to the drain electrode 130b of the TFT.

A pixel-defining film 164 may be located on the anode electrode 150. The pixel-defining film 164 may include an opening that exposes the anode electrode 150. The pixel-defining film 164 may be formed of an organic insulating material or an inorganic insulating material. For example, the pixel-defining film 164 may include a material such as photoresist, a polyimide resin, an acrylic resin, a silicon compound, or a polyacrylic resin.

An organic layer EL may be located on the top surface of the anode electrode 150 and in the opening of the pixel-defining film 164. The organic layer EL is illustrated as being located only in the opening of the pixel-defining film 164, but embodiments according to the present disclosure are not limited thereto. The organic layer EL may be formed to extend from the opening of the pixel-defining film 164 to the top surface of the pixel-defining film 164.

The organic layer EL may include an organic light-emitting layer EL1, a hole injection/transport layer EL2, and an electron injection/transport layer EL3. The hole injection/transport layer EL2 and the electron injection/transport layer EL3 are illustrated as being single-layer films, but may be stacks of multiple injection layers and multiple transport layers. At least one of the hole injection/transport layers EL2 or EL3 may be a common layer formed across a plurality of pixels PX.

A cathode electrode 160 is located on the organic layer EL and the pixel-defining film 164. The cathode electrode 160 may be a common electrode formed across a plurality of pixels PX.

A thin-film encapsulation layer 180 is located on the organic layer EL. The thin-film encapsulation layer 180 may cover an organic light-emitting element "OLED". The thin-film encapsulation layer 180 may be a laminated film in which at least one inorganic film and at least one organic film are alternately stacked. For example, the thin-film encapsulation layer 180 may include a first inorganic film 181, an organic film 182, and a second inorganic film 183, which are sequentially stacked.

A touch member 200 may be located on the thin-film encapsulation layer 180. For example, the touch member 200 may be of an electrostatic capacitive type. The touch member 200 may be formed directly on the thin-film encapsulation layer 180 without the aid of an additional adhesive layer or may be coupled to the thin-film encapsulation layer 180 via an adhesive layer.

Display devices according to other embodiments of the present disclosure will hereinafter be described. Like reference numerals indicate like elements in the accompanying drawings, and thus, some descriptions thereof may be omitted or simplified.

Figure 16A:
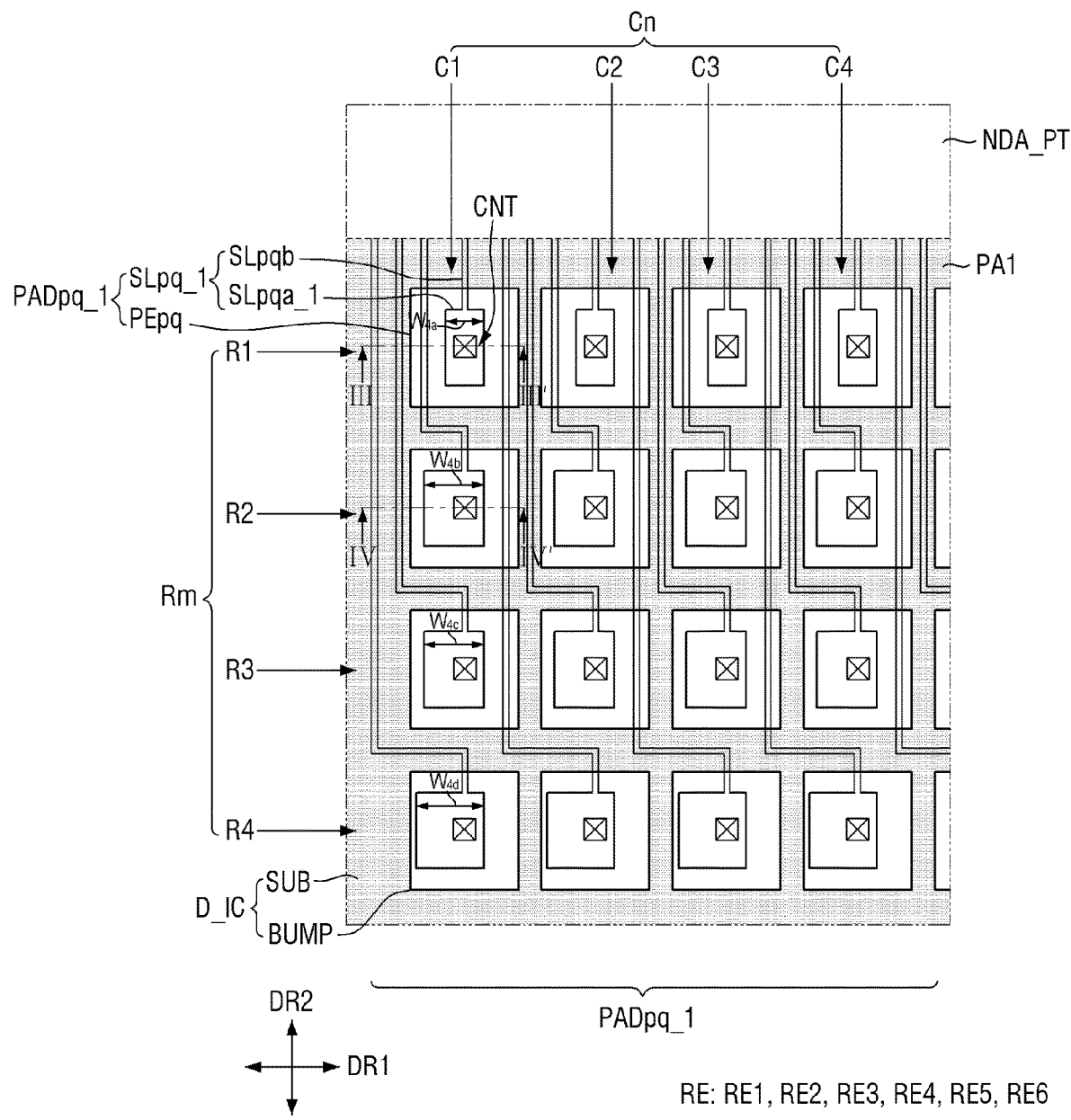
FIG. 16A is a layout view illustrating signal lines and dummy separation line parts of a display device according to some example embodiments of the present disclosure.
Figure 16B:
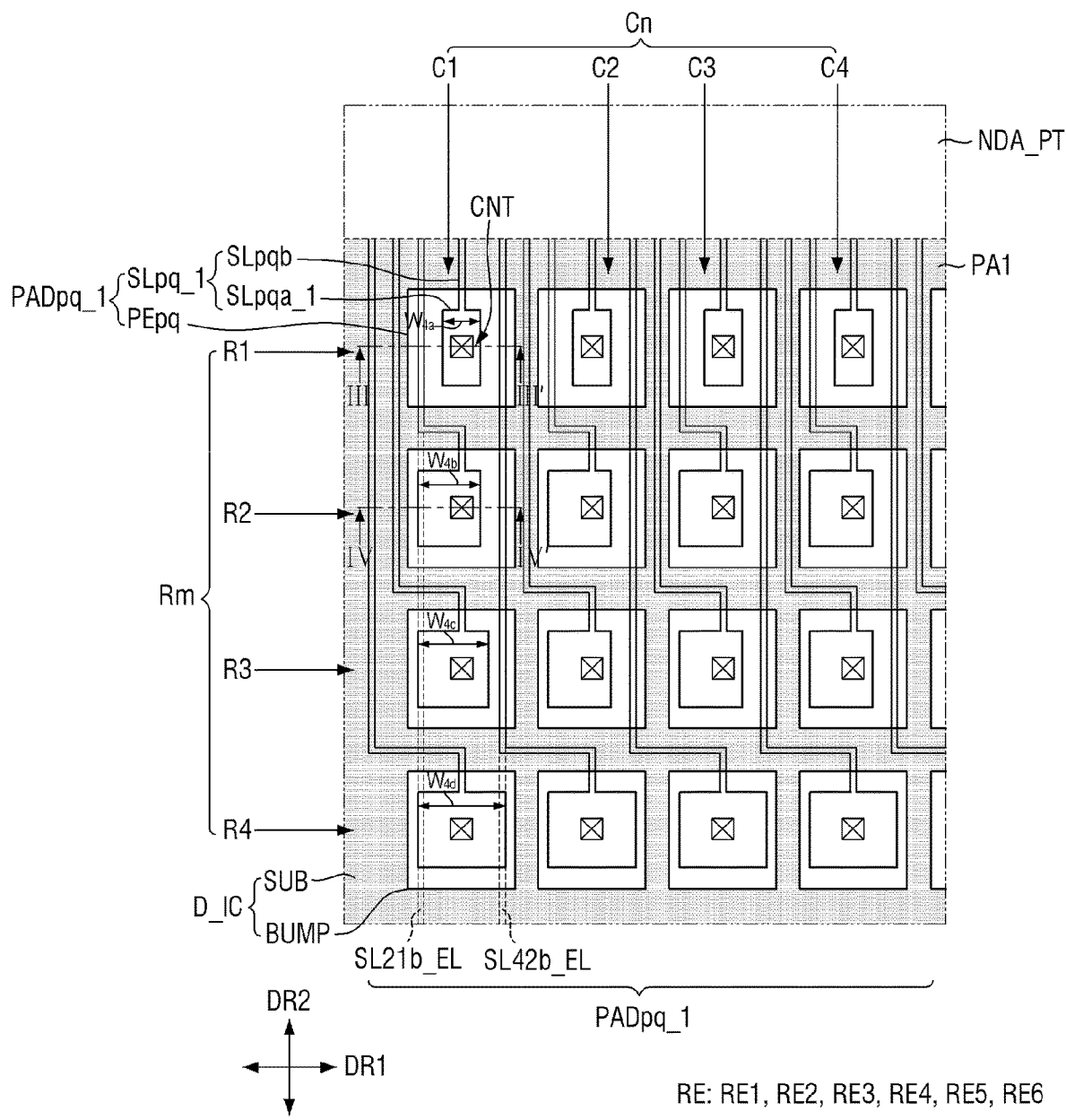
FIG. 16B is a layout view illustrating a modified example of FIG. 16A according to some example embodiments.
Figure 17:
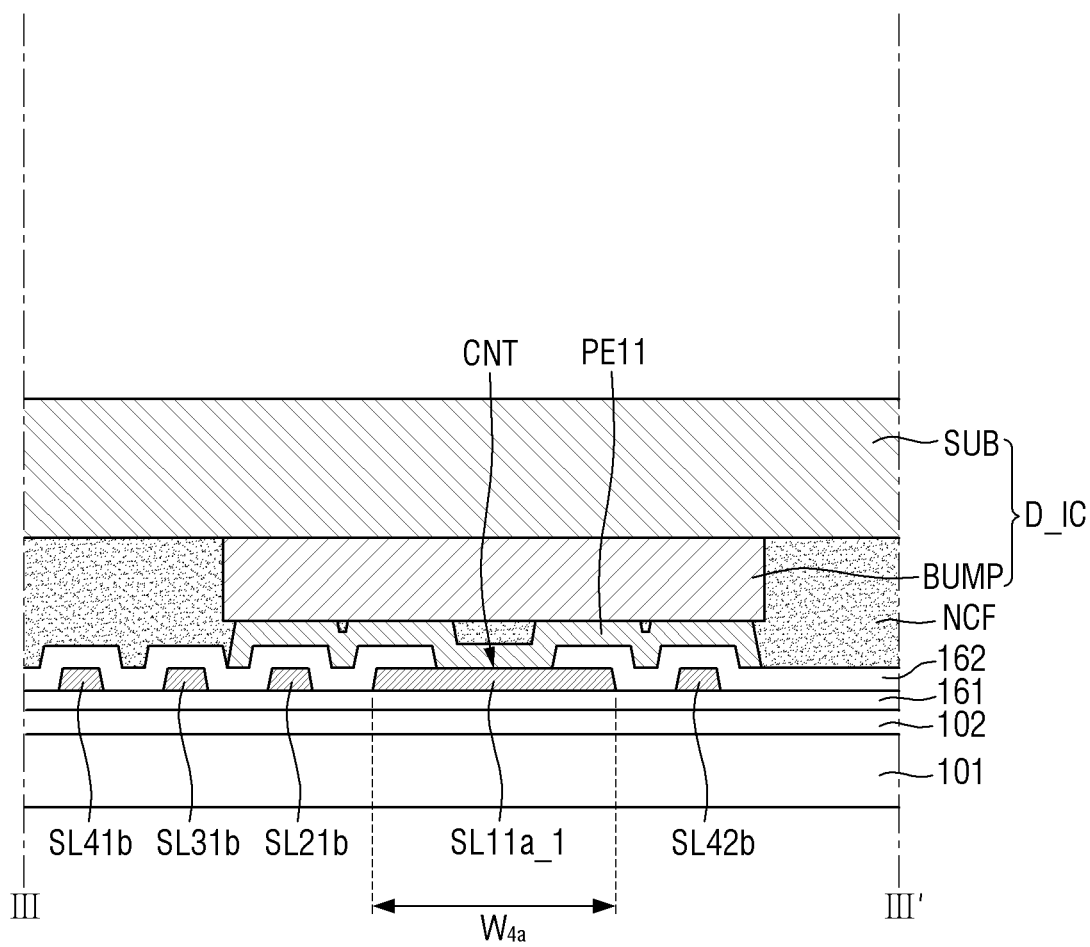
FIG. 17 is a cross-sectional view taken along the line III-III' of FIG. 16A.
Figure 18:
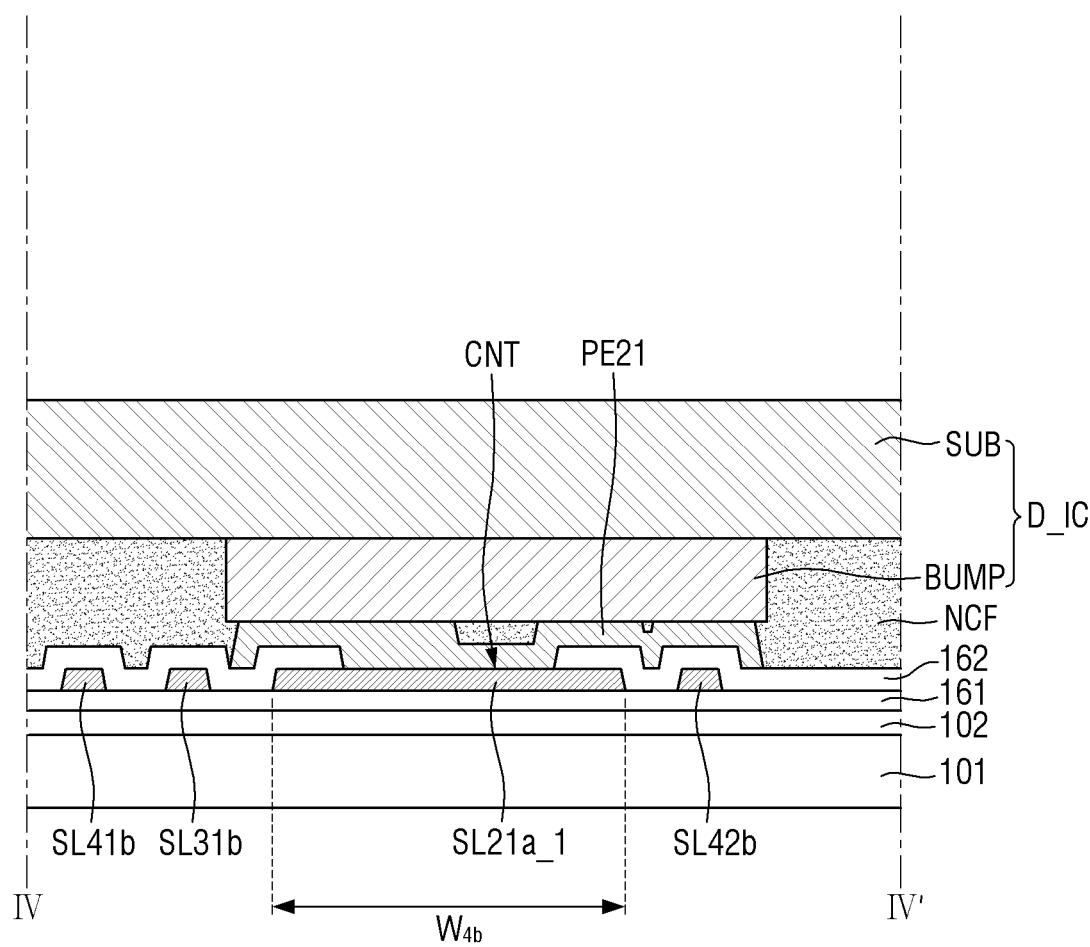
FIG. 18 is a cross-sectional view taken along the line IV-IV' of FIG. 16A.

FIG. 16A is a layout view illustrating signal lines and dummy separation line parts of a display device according to some example embodiments of the present disclosure, FIG. 16B is a layout view illustrating a modified example of FIG. 16A, FIG. 17 is a cross-sectional view taken along line III-III' of FIG. 16A, and FIG. 18 is a cross-sectional view taken along line IV-IV' of FIG. 16A.

Referring to FIGS. 16A through 18, the display device of FIGS. 16A through 18 differs from the display device 1 of FIG. 4 in that signal lines SLpq_1 include pad contact parts SLpqa_1 having different widths.

According to some example embodiments, the signal lines SLpq_1 may include pad contact parts SLpqa_1 having different widths. The display device of FIGS. 16A through 18 differs from the display device 1 of FIG. 4 in that dummy separation line parts RE are not provided.

The width, in the first direction DR1, of the pad contact parts SLpqa_1 may differ from one row Rm to another row Rm. For example, a (1,1)-th pad contact part SL11a_1 in a first row R1 may have a 4a-th width $W_{4a}$, a (2,1)-th pad contact part SL21a_1 in a second row R2 may have a 4b-th width $W_{4b}$, a (3,1)-th pad contact part SL31a_1 in a third row 31 may have a 4c-th width $W_{4c}$, and a (4,1)-th pad contact part SL41a_1 in a fourth row R4 may have a 4d-th width $W_{4d}$.

The width of the pad contact parts SLpqa_1 may gradually increase in a direction toward a second side, in the second direction DR2, of the display device of FIGS. 16A through 18. For example, the 4b-th width $W_{4b}$ may be greater than the 4a-th width $W_{4a}$, the 4c-th width $W_{4c}$ may be greater than the 4b-th width $W_{4b}$, and the 4d-th width $W_{4d}$ may be greater than the 4c-th width $W_{4c}$.

As illustrated in FIG. 16A (FIGS. 17 and 18), the (2,1)-th pad contact part SL21a_1, which is arranged in the second row R2, may be expanded further toward a (1,3)-th line part SL13b (a (3,1)-th line part SL31b) than a (1,1)-th pad contact part SL11a_1. The (2,1)-th pad contact part SL21a_1, which is expanded toward a (3,3)-th line part SL31b (the (3,1)-th line part SL31b), may cover even a region where a (2,1)-th line part SL21b is located, but embodiments according to the present disclosure are not limited thereto.

If the (1,1)-th pad contact part SL11a_1 is widened, the (1,1)-th pad contact part SL11a_1 may be short-circuited from the (2,1)-th line part SL21b. However, the (2,1)-th pad contact part SL21a_1 can be widened, but not to the extent that the (2,1)-th pad contact part SL21a_1 is short-circuited from a (3,1)-th signal line SL31_1. Similarly, the (3,1)-th pad contact part SL31a_1 can be widened, but not to the extent that the (3,1)-th pad contact part SL31a_1 is short-circuited from a (4,1)-th signal line SL41_1.

The (3,1)-th pad contact part SL31a_1, which is arranged in the third row R3, may at least partially overlap with the (2,1)-th line part SL21b in the second direction DR2.

By widening the pad contact parts SLpqa_1, but not to the extent that the pad contact parts SLpqa_1 are short-circuited from their respective neighboring line parts SLpqb, which are electrically isolated from the pad contact parts SLpqa_1, the contact areas of the pad contact parts SLpqa_1 and pad electrodes PEpq can be increased. As a result, the overall resistance of pads PADpq can be reduced.

The width, in the first direction DR1, of the pad contact parts SLpqa_1 may vary depending on the overlapping areas of the pad electrodes PEpq and the line parts SLpqb.

FIG. 16B illustrates a first line part extension line SL21b_EL, which is a line extended from the (2,1)-th line part SL21b in the second direction DR2, and a second line part extension line SL42b_EL, which is a line extended from a (4,2)-th line part SL42b in the second direction DR2.

A first pad contact part long side (see SL41a_LS1 of FIG. 7A) of the (1,1)-th pad contact part SL11a_1 and a first pad contact part long side of the (2,1)-th pad contact part SL21a_1 may be aligned with each other in the second direction DR2, and a second pad contact part long side of the (2,1)-th pad contact part SL21a_1 may protrude beyond a second pad contact part long side of the (1,1)-th pad contact part SL11a_1 in a direction toward the second side, in the first direction DR1, of the display device of FIGS. 16A through 18. Alternatively, the second pad contact part long side of the (2,1)-th pad contact part SL21a_1 may be aligned with the first line part extension line SL21b_EL in the second direction DR2. A (2,1)-th pad electrode PE21, unlike a (1,1)-th pad electrode PE11, does not overlap with a line part, on the second side, in the first direction DR1, of the display device of FIGS. 16A through 18. However, because the (2,1)-th pad contact part SL21a_1 is further expanded toward the second side, in the first direction DR1, of the display device of FIGS. 16A through 18, a protrusion may be formed on the surface of the (2,1)-th pad electrode PE21 to have the same area as a protrusion on the surface of the (1,1)-th pad electrode PE11. The 4b-th width $W_{4b}$ may be greater than the 4a-th width $W_{4a}$.

The first pad contact part long side of the (1,1)-th pad contact part SL11a_1 and a first pad contact part long side of the (3,1)-th pad contact part SL31a_1 may be aligned with each other in the second direction DR2, and a second pad contact part long side of the (3,1)-th pad contact part SL31a_1 may be aligned with the second pad contact part long side of the (2,1)-th pad contact part SL21a_1 in the second direction DR2. However, embodiments according to the present disclosure are not limited thereto. Alternatively, the second pad contact part long side of the (3,1)-th pad contact part SL31a_1 may protrude toward the second side, in the first direction DR1, of the display device of FIGS. 16A through 18.

A second pad contact part long side of the (3,1)-th pad contact part SL31a_1 and a second pad contact part long side of the (4,1)-th pad contact part SL41a_1 may be aligned with each other in the second direction DR2, and a first pad contact part long side of the (4,1)-th pad contact part SL41a_1 may protrude beyond a first pad contact part long side of the (3,1)-th pad contact part SL31a_1 in a direction toward a first side, in the first direction DR1, of the display device of FIGS. 16A through 18. The first pad contact part long side of the (4,1)-th pad contact part SL41a_1 may be aligned with the second line part extension line SL42b_EL in the second direction DR2. A (4,1)-th pad electrode PE41, unlike a (3,1)-th pad electrode PE31, does not overlap with a line part, on the first side, in the first direction DR1, of the display device of FIGS. 16A through 18. However, because the (4,1)-th pad contact part SL41a_1 is further expanded toward the first side, in the first direction DR1, of the display device of FIGS. 16A through 18, a protrusion may be formed on the surface of the (4,1)-th pad electrode PE41 to have the same area as a protrusion on the surface of the (3,1)-th pad electrode PE31. The 4d-th width $W_{4d}$ may be greater than the 4c-th width $W_{4c}$.

Figure 19:
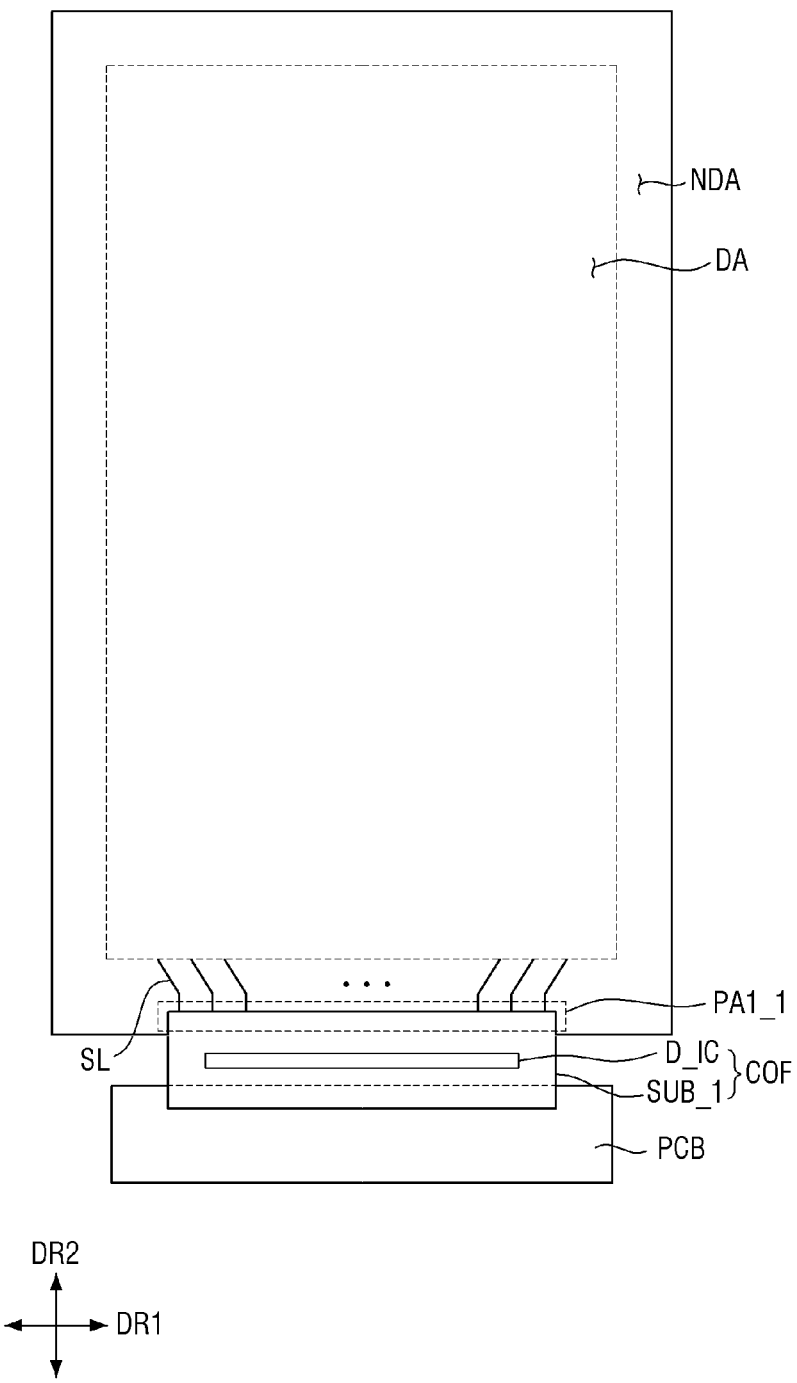
FIG. 19 is a plan view of a display device according to some example embodiments of the present disclosure.

FIG. 19 is a plan view of a display device according to some example embodiments of the present disclosure.

Referring to FIG. 19, the display device of FIG. 19 differs from the display device 1 of FIG. 1 in that a driving member D_IC is provided in the form of a chip-on-film (COF) "COF".

According to some example embodiments, the driving member D_IC may be provided in the form of the COF "COF". The COF "COF" may include a substrate SUB_1 and the driving member D_IC, which is mounted on the substrate SUB_1. The COF "COF" may be attached to a first pad area PA1_1 of a non-display area NDA.

Although embodiments of the invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device comprising:
a first conductive layer including a signal line, which includes a pad contact part and a line part having a smaller width than the pad contact part along a first direction and extending from the pad contact part in a second direction that intersects the first direction, and a first non-contact pattern, which is spaced apart from the pad contact part, on a first side along the first direction;
an insulating layer on the first conductive layer and including a contact hole that partially exposes the first conductive layer;
a second conductive layer on the insulating layer and including a first pad electrode, which is electrically connected to the first conductive layer through the contact hole,
wherein the first pad electrode overlaps with the pad contact part and the first non-contact pattern,
wherein the display device further comprises a third conductive layer on the second conductive layer and including a second pad electrode, which is electrically connected to the first pad electrode,
wherein the first pad electrode includes a main pad electrode part, which is connected to the pad contact part, and a sub-pad electrode part, which is spaced apart from the main pad electrode pad by a gap.

2. The display device of claim 1, wherein
the insulating layer is between the first non-contact pattern and the first pad electrode, and
the first non-contact pattern is electrically isolated from the first pad electrode.

3. The display device of claim 2, wherein the line part includes an overlapping line part, which overlaps with the first pad electrode in a thickness direction, and a non-overlapping line part, which does not overlap with the first pad electrode.

4. The display device of claim 3, wherein
the first pad electrode includes a first pad electrode side, which extends in the first direction and is on a first side in the second direction, and a second pad electrode side, which faces the first pad electrode side, and
the first non-contact pattern is spaced apart from the first and second pad electrode sides.

5. The display device of claim 4, wherein a distance between the first non-contact pattern and the first pad electrode side is equal to a distance between the first non-contact pattern and the second pad electrode side.

6. The display device of claim 5, wherein a length, in the second direction, of the first non-contact pattern is equal to a length, in the second direction, of the pad contact part.

7. The display device of claim 4, wherein
the first conductive layer further includes a second non-contact pattern, which is spaced apart from the pad contact part, on a second side in the first direction, and
the first pad electrode overlaps with the second non-contact pattern.

8. The display device of claim 7, wherein the second non-contact pattern passes through the first and second pad electrode sides.

9. The display device of claim 8, wherein a distance between the pad contact part and the first non-contact pattern is equal to a distance between the pad contact part and the second non-contact pattern.

10. The display device of claim 9, wherein
the first pad electrode includes a third pad electrode side, which extends in the second direction and is on the first side in the first direction, and a fourth pad electrode side, which faces the third pad electrode side, and
a distance between the first non-contact pattern and the third pad electrode side is equal to a distance between the second non-contact pattern and the fourth pad electrode side.

11. The display device of claim 7, wherein the second non-contact pattern passes through one of the first and second pad electrode sides and is spaced apart from the other of the first and second pad electrode sides.

12. The display device of claim 7, wherein the second non-contact pattern is spaced apart from the first and second pad electrode sides.

13. The display device of claim 12, wherein
a distance between the first non-contact pattern and the first pad electrode side is equal to a distance between the second non-contact pattern and the first pad electrode side, and
a distance between the first non-contact pattern and the second pad electrode side is equal to a distance between the second non-contact pattern and the second pad electrode side.

14. The display device of claim 1, wherein
the second pad electrode is in direct contact with a top surface of the insulating layer exposed by the gap, and
the display device further comprises a bump directly connected to the second pad electrode and a non-conductive coupling member between the bump and the second pad electrode, which is in direct contact with the top surface of the insulating layer exposed by the gap.

15. A display device comprising:
a first pad including a first pad contact part, which has a first width along a first direction, and a first pad electrode, which covers the first pad contact part; and
a second pad isolated from the first pad and adjacent to the first pad along a second direction that intersects the first direction, the second pad including a second pad contact part, which has a second width that is greater than the first width, and a second pad electrode, which covers the second pad contact part,
wherein
the first pad electrode overlaps with a first-side pattern, which is located in a same layer as the first pad contact part, on a first side of the first pad contact part, and a first second-side pattern, which is located on a second side of the first pad contact part, the second pad electrode overlaps with a second first-side pattern, which is located in a same layer as the second pad contact part, the first first-side pattern and the first second-side pattern are electrically isolated from the first pad, the second first-side pattern is electrically isolated from the second pad, and the first first-side pattern and the second first-side pattern are physically connected;

wherein the display device further comprises:

a first line part extending from the first pad contact part in the second direction;

a third pad including a third pad contact part, which has a third width that is greater than the second width, and a third pad electrode, which covers the third pad contact part, the third pad being isolated from the second pad and adjacent to the second pad in the second direction, wherein the third pad contact part overlaps with the first line part in the second direction.

16. The display device of claim 15, further comprising:

a second line part extending from the second pad contact part in the second direction, wherein the second line part forms the first second-side pattern.

17. The display device of claim 16, wherein the third pad electrode overlaps with a third first-side pattern, which is in a same layer as the third pad contact part, and the third first-side pattern is electrically isolated from the third pad.

18. The display device of claim 17, wherein the first, second, and third pad electrodes have a same size.

* * * * *